United States Patent
Yamase et al.

(10) Patent No.: US 8,415,984 B2
(45) Date of Patent: Apr. 9, 2013

(54) ELECTRONIC CIRCUIT SYSTEM, TRACK HOLD CIRCUIT MODULE, ELECTRONIC CIRCUIT OPERATION CONTROL METHOD, AND PROGRAM THEREOF

(75) Inventors: Tomoyuki Yamase, Tokyo (JP); Hidemi Noguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/121,224

(22) PCT Filed: Nov. 2, 2009

(86) PCT No.: PCT/JP2009/068769
§ 371 (c)(1),
(2), (4) Date: Mar. 28, 2011

(87) PCT Pub. No.: WO2010/053070
PCT Pub. Date: May 14, 2010

(65) Prior Publication Data
US 2011/0204927 A1 Aug. 25, 2011

(30) Foreign Application Priority Data
Nov. 5, 2008 (JP) .................................. 2008-284698

(51) Int. Cl.
*H03K 5/00* (2006.01)
(52) U.S. Cl. ........................... 327/94; 327/415; 341/100
(58) Field of Classification Search .................... 327/94, 327/415–417; 341/100
See application file for complete search history.

(56) References Cited

U.S. PATENT DOCUMENTS

| | | | |
|---|---|---|---|
| 4,583,183 A | 4/1986 | Winiecki et al. | |
| 5,808,571 A * | 9/1998 | Kuwata et al. | 341/100 |
| 7,605,726 B2 * | 10/2009 | Byeon | 341/100 |
| 7,616,725 B2 * | 11/2009 | Cao et al. | 375/371 |

FOREIGN PATENT DOCUMENTS

| | | |
|---|---|---|
| JP | 8-79080 A | 3/1996 |
| JP | 9-252251 A | 9/1997 |
| JP | 11-98101 A | 4/1999 |

OTHER PUBLICATIONS

International Search Report for PCT/JP2009/068769 mailed Dec. 15, 2009.
European search report for EP09824769.5 dated Oct. 11, 2012.
Poulton K et al: "A 1-GHz 6-bit ADC system", IEEE Journal of Solid-State Circuits, vol. SC-22, No. 6, Dec. 1987, pp. 962-970.

\* cited by examiner

*Primary Examiner* — Kenneth B. Wells

(57) ABSTRACT

Provided is an electronic circuit system which facilitates skew timing adjustment while preventing increase of power consumption. An electronic circuit system includes: a track hold circuit module formed by a hierarchical tree structure of track hold circuits which can track-hold an analog value of an analog signal; and a control signal generation module which supplies an operation control signal to each of the track hold circuits in the hierarchical tree structure. In the hierarchical tree structure, the number of track hold circuits of each of the hierarchies is stepwise changed from the first hierarchy of the input side to which an analog signal is inputted, toward the final hierarchy of the final output side as the number of hierarchies is increased.

13 Claims, 8 Drawing Sheets

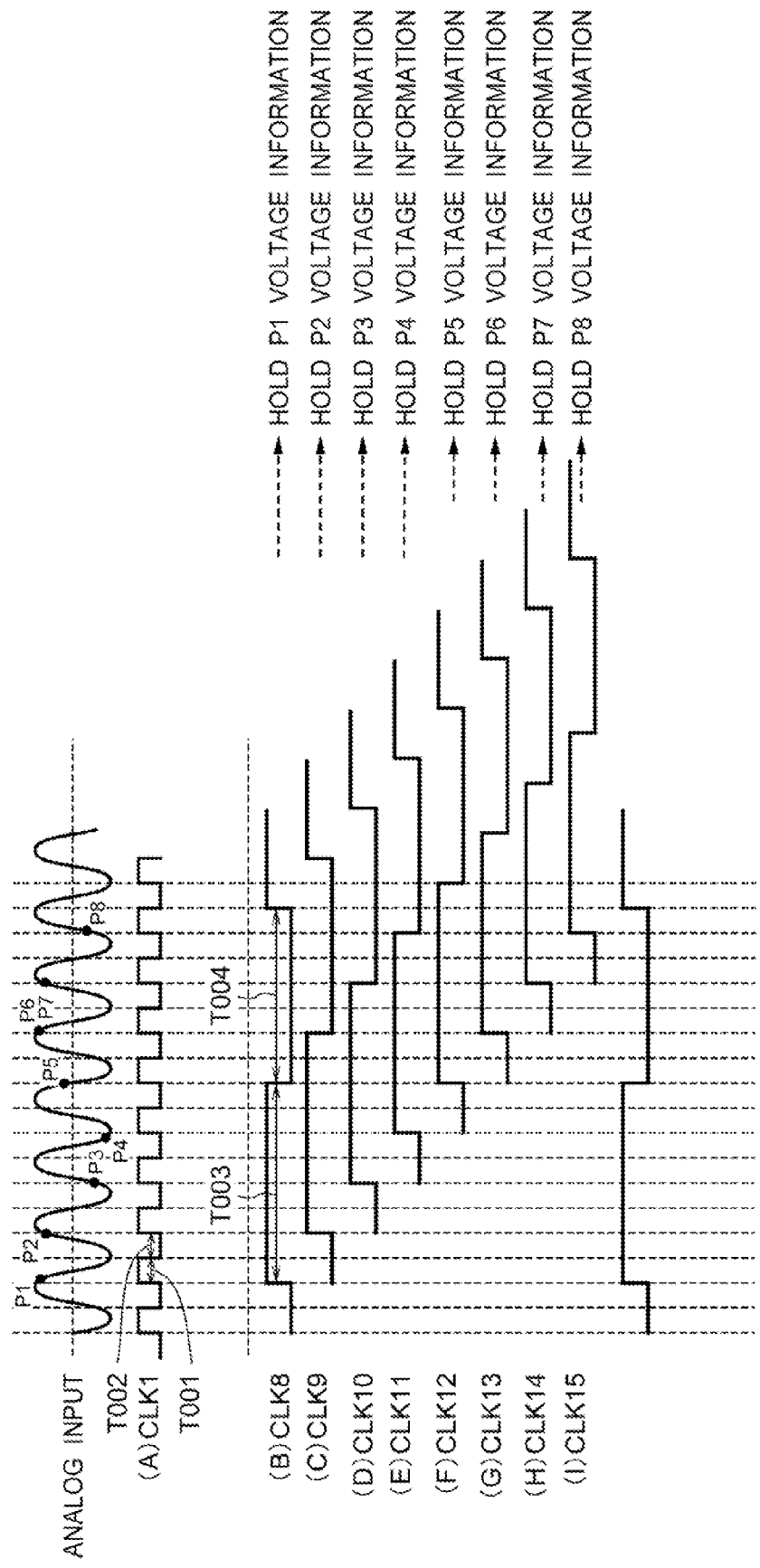

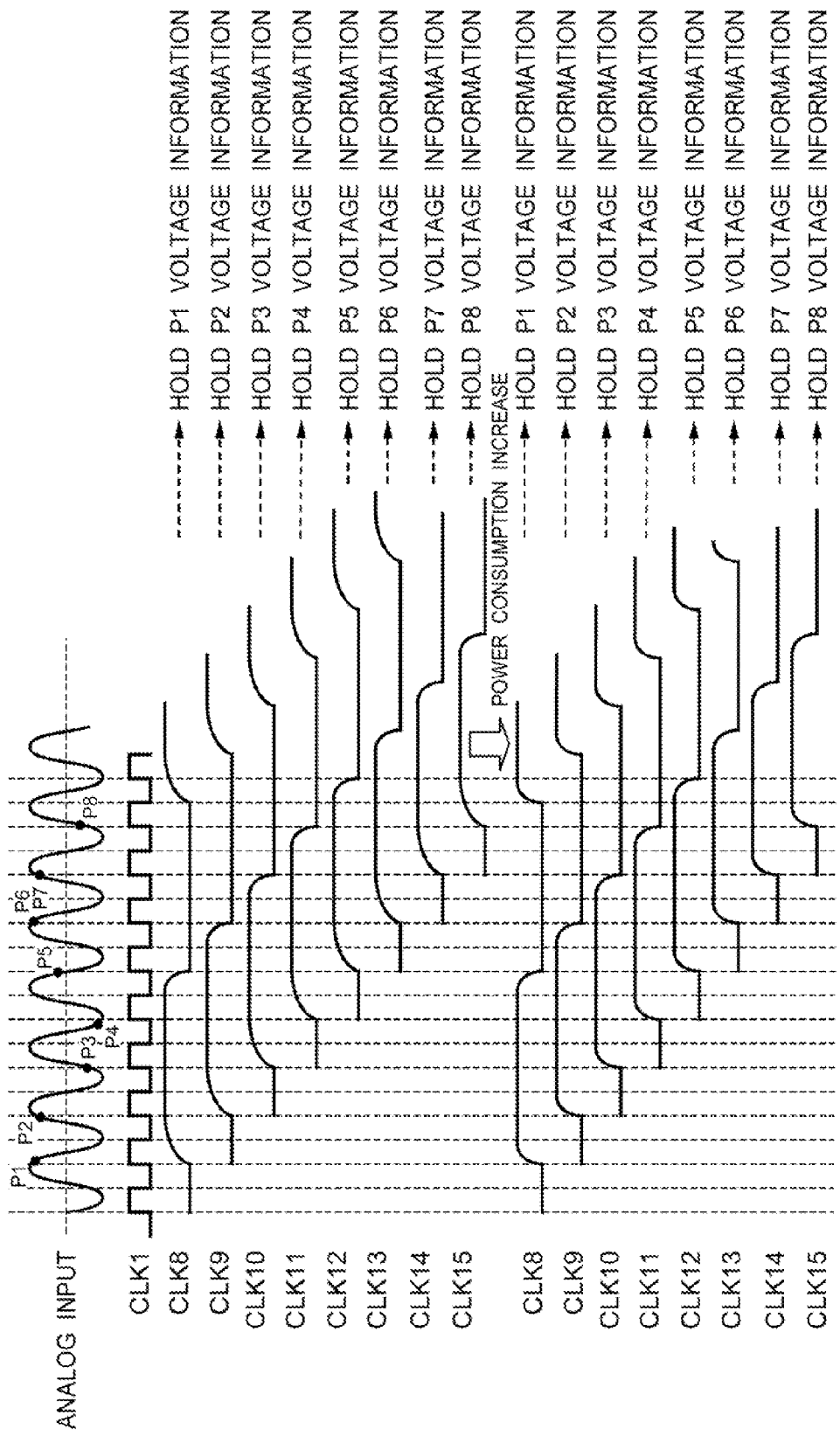

ELECTRONIC CIRCUIT SYSTEM, TRACK HOLD CIRCUIT MODULE, ELECTRONIC CIRCUIT OPERATION CONTROL METHOD, AND PROGRAM THEREOF

This Application is the National Phase of PCT/JP2009/068769, filed Nov. 2, 2009, which claims the Priority right based on Japanese Patent Application No. 2008-284698 filed on Nov. 5, 2008 and the disclosure thereof is hereby incorporated by reference in its entirety.

TECHNICAL FIELD

The present invention relates to an electronic circuit system, a track hold circuit module, an electronic circuit operation control method, and an electronic circuit operation control program.

BACKGROUND ART

As a circuit which samples an analog signal and holds an analog value, an S/H (Sample & Hold or also referred to as sample hold) circuit is known. This S/H circuit may also be called as a track hold circuit (hereinafter, this circuit will be referred to as a track hold circuit).

Like most of electronic circuits, data conversion circuits such as A/D conversion circuits or D/A conversion circuit using the track hold circuits are required to exhibit a still higher processing speed.

There are some techniques being proposed for satisfying such demands.

For example, there is a technique which uses a time interleave system that converts data by placing a plurality of data conversion circuits in parallel (Patent Document 1).

The time interleave system is a system which sequentially switches and operates a plurality of same circuits in order to increase the operation clock frequency equivalently.

Through placing two or more track hold circuits in parallel and operating each of the track hold circuits in a time interleave manner, the conversion speed can be doubled or more.

FIG. 6 is a block diagram showing an example of the structure of a track hold circuit that uses the time interleave system of such related technique.

In an electronic circuit system 201 of FIGS. 6, 11 and 18-25 are track hold circuits, Sin is an analog input signal terminal, and CLK1 and CLK8-CLK15 are clock signal input terminals.

An analog signal is inputted to the analog signal input terminal Sin of the track hold circuit 11. Each of eight outputs of the track hold circuit 11 is connected to the track hold circuits 18-25. Further, respective clock signals are inputted to the clock input terminals CLK1 and CLK8-CLK15 of the track hold circuits 11 and 18-25, and each of the track hold circuits 11 and 18-25 operates based thereupon.

In the electronic circuit system 210, a first hierarchy K1 (an input stage, a first stage) is formed by the track hold circuit 11. Further, in the electronic circuit system 210, a second hierarchy K2 (a final output stage, a second stage) is formed by the track hold circuits 18-25.

Now, the operation of the related technique shown in FIG. 6 will be described by referring to FIG. 7.

FIG. 7 is a timing chart showing timings of clock signals inputted to the clock signal input terminals CLK1 and CLK8-CLK15, and (A)-(I) of FIG. 7 show waveforms of each of those clock signals.

For example, the track hold circuit 11 operates at 16 GHz and track-holds the analog signal inputted from the analog input signal Sin.

The track hold circuits 18-25 of the second stage group track-hold the analog signals at 2 GHz while shifting the phases thereof form each other.

An analog signal is tracked at the timing of T001 in FIG. 7, and it is held at the timing of T002 in FIG. 7.

In the meantime, the track hold circuit 18 tracks an output signal of the track hold circuit 11 at T003 in FIG. 7, and holds it at the timing of T004.

Similarly, the track hold circuits 19-25 operate while shifting the phases thereof by 45 degrees (=360 degrees divided by 8 phases) from each other to track-hold the output signal of the track hold circuit 11.

That is, the track hold circuits 18-25 operate at 2 GHz but the phases thereof are shifted from each other by one period of 16 GHz, so that one of the track hold circuits 18-25 has tracked and held the clock signal at the point where one clock signal of 16 GHz of the track hold circuit 11 passes. Thus, the related technique shown in FIG. 6 is substantially equivalent to operating at 16 GHz.

As a result, through placing eight track hold circuits of 2 GHz in parallel and time-interleave operating each of those track hold circuits, it is possible to constitute the track hold circuit operating at 16 GHz.

Patent Document 1: Japanese Unexamined Patent Publication Hei 9-252251
Patent Document 2: Japanese Unexamined Patent Publication Hei 8-079080

DISCLOSURE OF THE INVENTION

Problems to be Solved by the Invention

In a case of the related technique shown in FIG. 6 and a case of Patent Document 1, a signal that has undergone track-hold processing executed by a track hold circuit 1 at a full-rate clock is supplied to the second-stage track hold circuit group.

In the second-stage track hold circuit group, while the supplied clock signal is of ⅛ frequency of the full-rate signal, the signal from the previous stage is a signal containing a full-rate component tracked at the full-rate clock. Thus, the track hold circuits 2-9 of the second-stage track hold circuit group are required to have a high-speed property which can process the signal corresponding to the full rate.

In the case of FIG. 6, eight track hold circuits required to have the high-speed property capable of processing the signals conversion-processed at the full-rate clock are required for the second-stage track hold group.

In general, the power consumption is increased to acquire a fine property for performing high-frequency signal processing. Thus, it is an issue that the power consumption is increased for processing high-frequency analog signals.

Further, as shown in FIG. 8, it is necessary to perform sampling within the period of holding a signal in the first stage. Thus, it is necessary for the clock of the signal of the second-stage track hold circuit group to rise within the hold time. Therefore, the power consumption is increased further, since it is necessary to increase the power consumption of a clock buffer and to shorten the rise of the clock.

Further, since the second-stage track hold circuit group needs to generate signals of eight phases, the phase adjustment becomes extremely difficult and the skew timing adjustment becomes complicated as well.

An object of the present invention is to overcome the issues of the related technique described above, and to provide an electronic circuit system, a track hold circuit module, an electronic circuit operation control method, and an electronic circuit operation control program, which can suppress the difficulty of skew timing adjustment while preventing the increase in the power consumption.

Means for Solving the Problems

In order to achieve the foregoing object, the electronic circuit system according to the present invention is characterized to include: a track hold circuit module structured by forming track hold circuits capable of tracking and holding an analog value of an analog signal into a hierarchical tree structure; and a control signal generation module which supplies respective operation control signals to each of the track hold circuits in the hierarchical tree structure, wherein the hierarchical tree structure is a structure in which the number of the track hold circuits in each of the hierarchies gradually increases as the hierarchy increases from a first hierarchy on an input side to which the analog signal is inputted towards a final hierarchy on a final output side.

The track hold circuit module according to the present invention is characterized to have a hierarchical tree structure formed by using track hold circuits capable of tracking and holding an analog value of an analog signal, wherein the hierarchical tree structure is a structure in which the number of the track hold circuits in each of the hierarchies gradually increases as the hierarchy increases from a first hierarchy on an input side to which the analog signal is inputted towards a final hierarchy on a final output side.

The electronic circuit operation control method according to the present invention is for controlling an operation of each track hold circuit employed in an electronic circuit system which includes a track hold circuit module structure by forming the track hold circuits capable of tracking and holding an analog value of an analog signal into a hierarchical tree structure, and a control signal generation module which supplies respective operation control signals to each of the track hold circuits, and the method is characterized to include: inputting the analog signal from a first hierarchy on an input side in the hierarchical tree structure; controlling to set each frequency of respective operation control signals supplied to each of the track hold circuits for respectively operating each of the track hold circuits, the number of which changes gradually as the hierarchy increases towards a final hierarchy on a final output side of the hierarchical tree structure, at different frequencies in each of the hierarchies; controlling to generate each of the operation control signals according to the number for operating each of the track hold circuits within the hierarchy in a time interleave manner; and outputting each analog value from each output terminal of each of the track hold circuits of the final hierarchy of the hierarchical tree structure.

The electronic circuit operation control program according to the present invention is characterized to be capable of causing a computer, which constitutes a control signal generation module of an electronic circuit system which includes a track hold circuit module structured by forming track hold circuits capable of tracking and holding an analog value of an analog signal into a hierarchical tree structure and the control signal generation module which supplies respective operation control signals to each of the track hold circuits, to execute: a first control function which controls to set each frequency of operation control signals supplied to each of the track hold circuits for respectively operating each of the track hold circuits, the number of which changes gradually as the hierarchy increases from a first hierarchy on an input side towards a final hierarchy on a final output side of the hierarchical tree structure, at different frequencies in each of the hierarchies; and a second control function which controls to generate each of the operation control signals according to the number for operating each of the track hold circuits within the hierarchy in a time interleave manner.

Effect of the Invention

With the present invention, the power consumed in each hierarchical stage can be used in a highly efficient manner through forming the track hold circuits in a hierarchical tree structure. Therefore, it is possible to suppress the power consumption compared to the case of the related technique in terms of the entire power consumption.

BRIEF DESCRIPTION OF THE DRAWINGS

FIG. 7 is a timing chart showing an example of an operation processing procedure executed in the track hold circuit of the related technique; and FIG. 8 is a timing chart showing an example of an operation processing procedure executed in the track hold circuit of the related technique.

BEST MODES FOR CARRYING OUT THE INVENTION

Basic Structure of Electronic Circuit System

Figure 1:
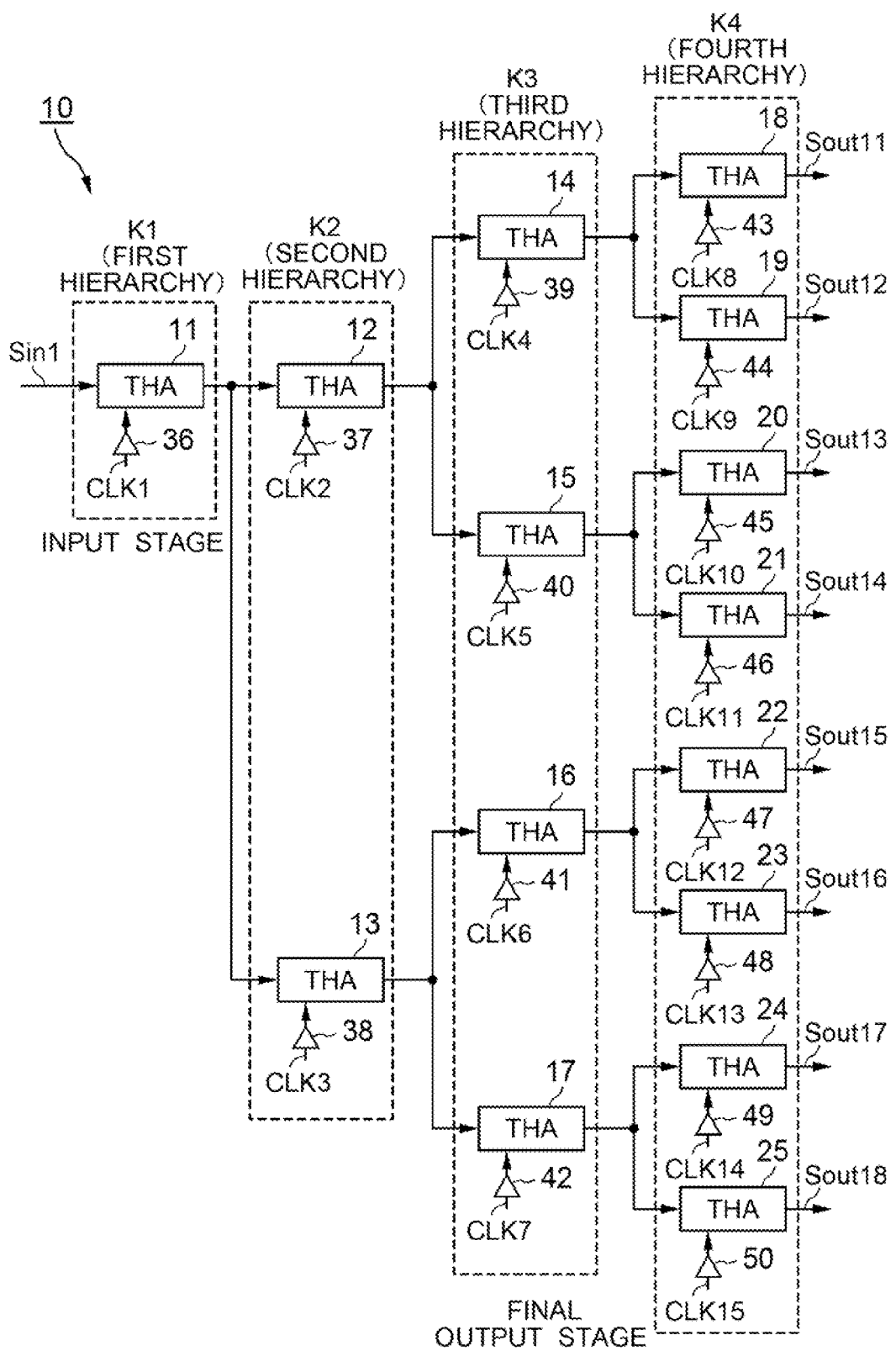
FIG. 1 is a circuit diagram showing an example of the detailed structure of a track hold circuit module in an electronic circuit system according to a first exemplary embodiment of the invention.

First, the basic structure of the electronic circuit system will be described. The electronic circuit system (e.g., reference numeral 1 shown in FIG. 2) according to the present invention includes: a track hold circuit module (e.g., reference numeral 10 shown in FIG. 1 and FIG. 2) structured by forming track hold circuits (e.g., reference numerals 11-25 shown in FIG. 1) capable of tracking and holding an analog value of an analog signal into a hierarchical tree structure; and a timing controller (e.g., reference numeral 60 shown in FIG. 1) which is an example of a control signal generation module that supplies respective operation control signals to each of the track hold circuits of the hierarchical tree structure.

The hierarchical tree structure is a structure in which the number of the track hold circuits in each hierarchy gradually changes (e.g., increases) as the number of the hierarchy increases from the first hierarchy (e.g., reference numeral K1 shown in FIG. 1) on the input side where the analog signal is inputted towards the final hierarchy (e.g., reference numeral K4 shown in FIG. 1) on the final output side.

The timing controller as an example of the control signal generation module includes: a first control function which controls the operation control signal in such a manner that each of the track hold circuits in each hierarchy operates at different frequencies; and a second control function which controls the operation control signal in such a manner that each of the track hold circuits within the hierarchy operates in a time interleave manner.

The first control function includes a function which controls the operation control signal to decrease the frequency in order as the hierarchy increases from the first hierarchy towards the final hierarchy.

Figure 4:
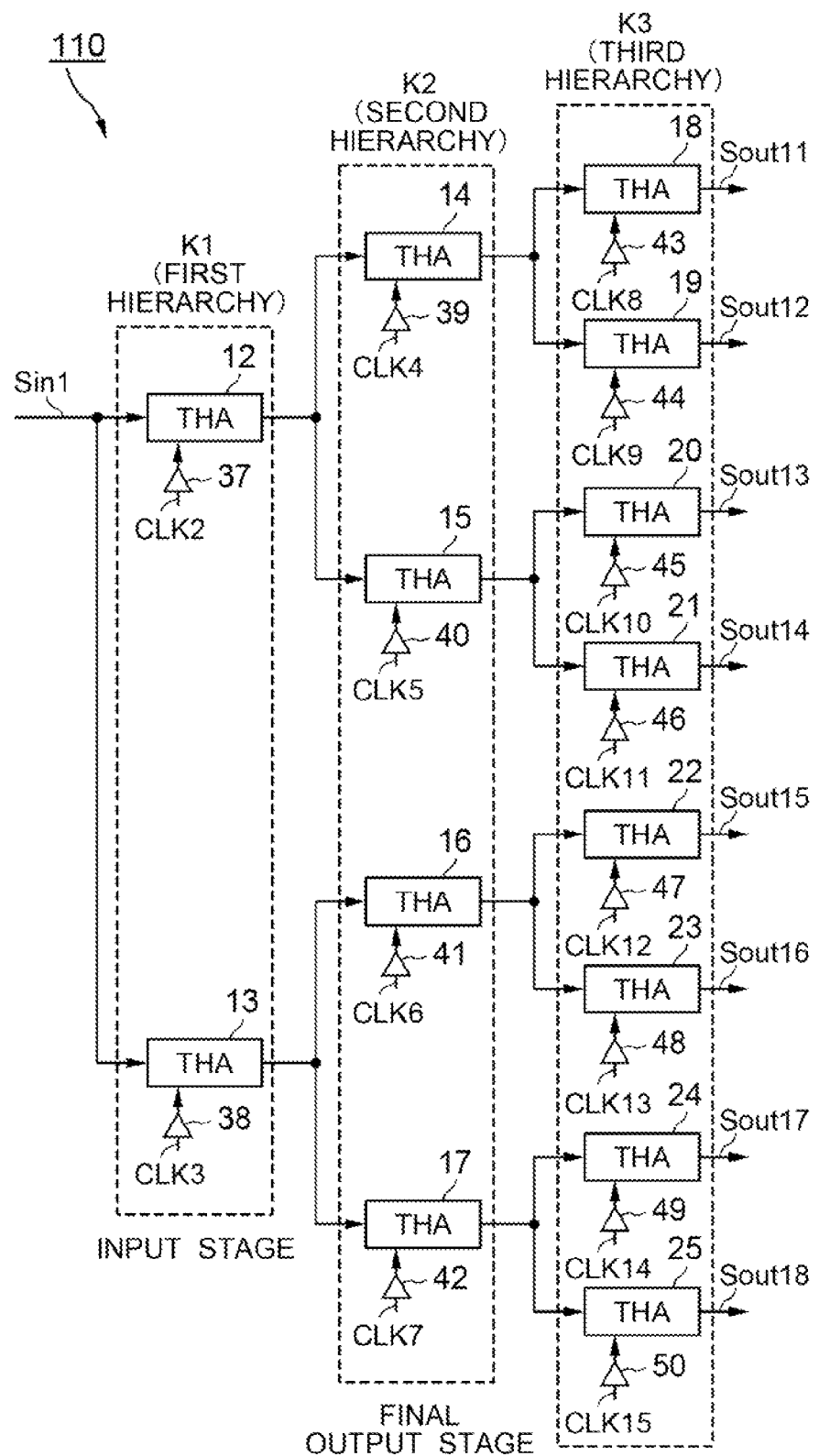
FIG. 4 is a circuit diagram showing an example of the detailed structure of a track hold circuit module in an electronic circuit system according to a third exemplary embodiment of the invention.
Figure 5:
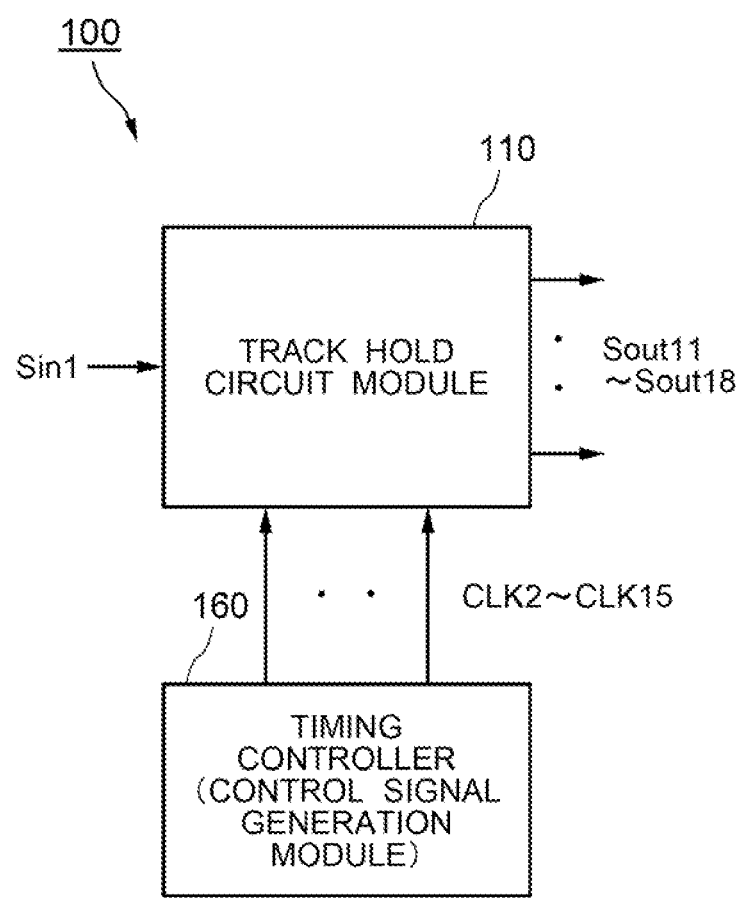
FIG. 5 is a block diagram showing an example of the entire structure of the electronic circuit system according to the third exemplary embodiment of the invention.
Figure 6:
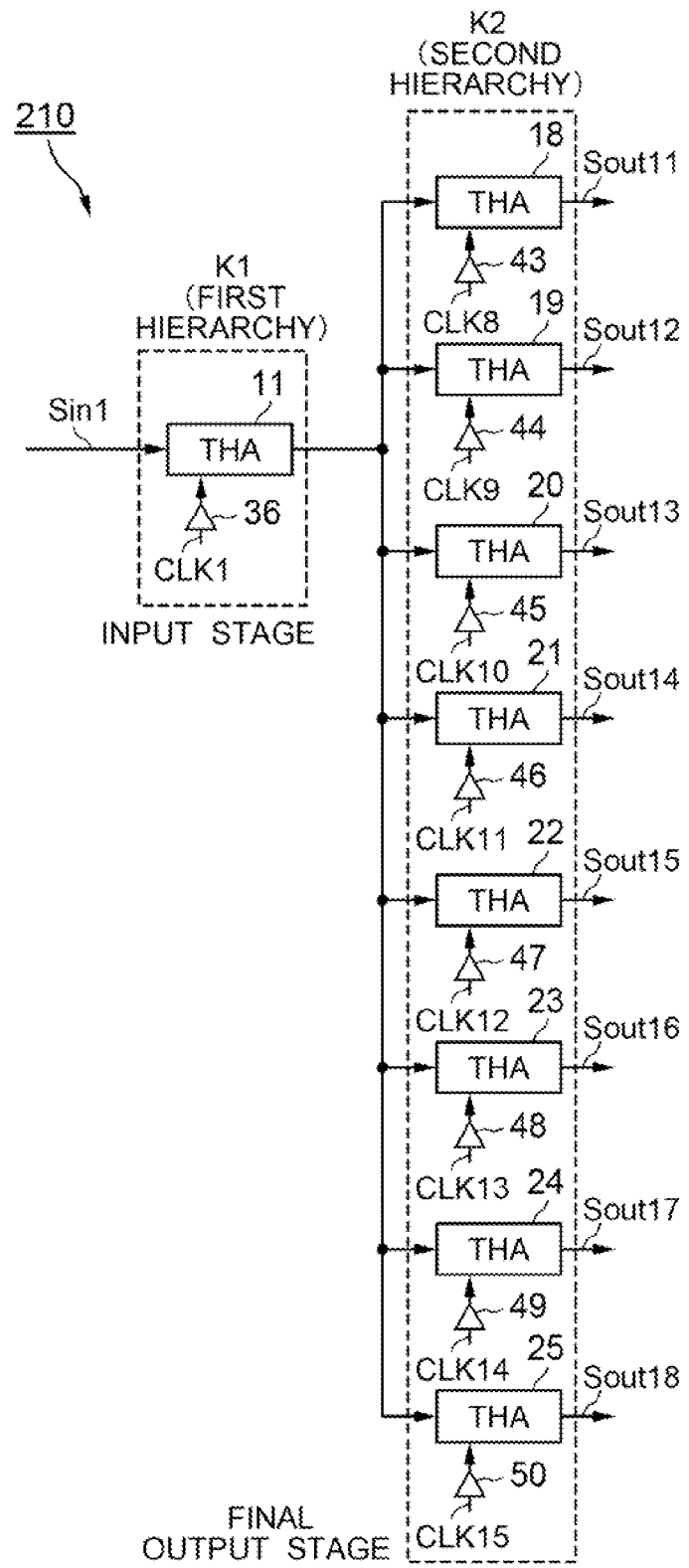
FIG. 6 is a circuit diagram showing an example of the detailed structure of a track hold circuit in an electronic circuit system according to a related technique.

Further, the hierarchical tree structure may be formed as a structure in which the first hierarchy includes divided two track hold circuits, and the number of the track hold circuits un each of the hierarchies thereafter increases gradually (FIG. 4).

Through forming the track hold circuits into the hierarchical tree structure in the manner described above, the power consumed in each of the layers can be used highly efficiently. Therefore, the power consumption can be suppressed compared to the related technique in terms of the entire power consumption.

That is, the present invention forms a plurality of track hold circuits into a hierarchical tree structure to improve the efficiency.

Out of that structure, the track hold circuit module according to the first exemplary embodiment of the invention is formed as a tree structure constituted with a plurality of hierarchies (stages) of track hold circuits having the analog signal input terminal as a root, in which: a signal inputted from the analog signal input terminal inputs to the track hold circuit; the outputs thereof are branched into an arbitrary number; and the signal is outputted to the track hold circuit group of a next hierarchy (stage). The frequency of the clock signal supplied to each hierarchy is decreased in order, so that the frequency component of the signal of each system is lowered in speed every time the hierarchy (stage) increases and a desired number of outputs can be acquired.

As in this structure, through decreasing the rate of the signal to be processed in order every time the tree structure is branched, the power consumption of the track hold circuits required in each stage can be suppressed. As a result, the power consumption of the track hold circuits employing the time interleave system can be decreased.

A more specific example of the exemplary embodiment of such "electronic circuit system" according to the present invention will be described hereinafter by referring to the drawings.

First Exemplary Embodiment

Entire Structure of Electronic Circuit System

First, specific structures of the electronic circuit system according to the exemplary embodiment will be described, and detailed structures of each part will be described thereafter. FIG. 1 is a circuit diagram showing an example of the entire schematic structure of the track hold circuit module of the electronic circuit system according to the first exemplary embodiment of the invention.

Figure 2:
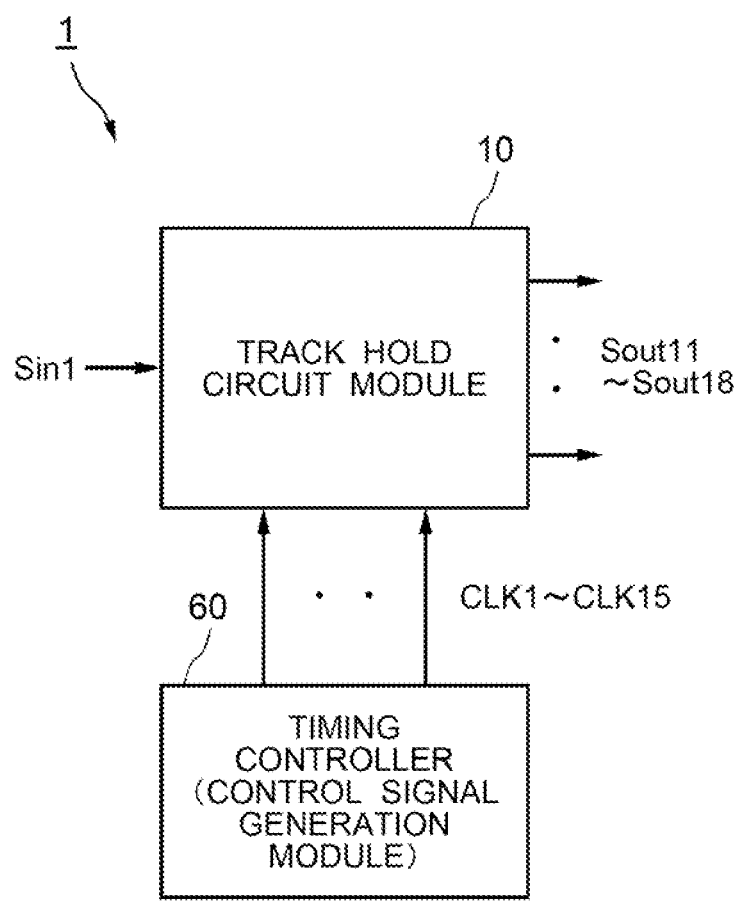
FIG. 2 is a block diagram showing an example of the entire structure of the electronic circuit system according to the first exemplary embodiment of the invention.

As shown in FIG. 1 and FIG. 2, the electronic circuit system 1 according to the exemplary embodiment is formed by including: a track hold circuit module 10 structured by forming the track hold circuits 11-25 which are capable of tracking and holding an analog value of an analog signal into a hierarchical tree structure; and a timing controller 60 which is an example of a control signal generation module that supplies respective operation control signals (clock signals inputted to CLK1-CLK15) to each of the track hold circuits of the hierarchical tree structure.

The track hold circuit module 10 is a circuit which performs operations in a time interleave system formed as a hierarchical tree structure (branching structure) designed to achieve a high-speed track hold circuit.

The track hold circuit module 10 has a hierarchical tree structure (branching structure). Specifically, the track hold circuit module 10 has a four-stage hierarchical structure constituted with a first hierarchy K1, a second hierarchy K2, a third hierarchy K3, and a fourth hierarchy K4.

Further, the track hold circuit module 10 includes: a single analog signal input terminal Sin; a single track hold circuit (THA) 11 which is formed in the first hierarchy (a first stage, an input stage) K1 and operates at a full rate (a first frequency); two track hold circuits (THAs) 12, 13 which are formed in the second hierarchy (a second stage) K2 and operate at a second frequency; four track hold circuits (THAs) 14-17 which are formed in the third hierarchy (a third stage) K3 and operate at a third frequency; eight track hold circuits (THAs) 18-25 which are formed in the fourth hierarchy (a fourth stage, a final output stage) K4 and operate at a fourth frequency; output terminals Sout11-Sout18 of the tracked and held signals; clock buffers 36-50 as clock signal temporary holding sections; and clock signal input terminals CLK1-CLK15.

The hierarchical tree structure of the track hold circuit module 10 is formed to be vertically symmetric in each hierarchy, and formed to be operable with a time interleave system in each hierarchy.

In the hierarchical tree structure, the tree is branched at a first branch point by a branching number of "2" to form the second hierarchy K2 with each of the second hierarchy branches by taking the analog signal input terminal Sin as a root and the first layer K1 as a trunk.

Further, in the hierarchical tree structure, the tree is branched at an upper second branch point by a branching number of "2" from one of the second hierarchy branches to form a part of the third hierarchy K3 with each of the upper third hierarchy branches. Similarly, in the hierarchical tree structure, the tree is branched at a lower second branch point by a branching number of "2" from the other second hierarchy branch to form a part of the third hierarchy K3 with each of the lower third hierarchy branches.

Furthermore, in the hierarchical tree structure, the tree is branched at an uppermost third branch point by a branching number of "2" from one of the upper third hierarchy branches to form a part of the fourth hierarchy K4 with each of the uppermost fourth hierarchy branches. Similarly, in the hierarchical tree structure, the tree is branched at an upper third branch point by a branching number of "2" from the other upper third hierarchy branch to form a part of the fourth hierarchy K4 with each of the upper fourth hierarchy branches. Similarly, in the hierarchical tree structure, the tree is branched at the lower third branch point by a branching number of "2" from one of the lower third hierarchy branches to form a part of the fourth hierarchy K4 with each of the lower fourth hierarchy branches. Similarly, in the hierarchical tree structure, the tree is branched at a lowermost third branch point by a branching number of "2" from the other lower third hierarchy branch to form a part of the fourth hierarchy K4 with each of the lowermost fourth hierarchy branches.

In the exemplary embodiment, the first frequency, the second frequency, the third frequency, and the fourth frequency are different from each other.

The track hold circuit 11 of the first hierarchy K1 operates according to a first clock signal of the first frequency supplied from the timing controller 60 (tracks and holds the analog signal from the analog signal input terminal Sin). The first clock signal inputs to the track hold circuit 11 from the clock signal input terminal CLK1 via the clock buffer 36.

The track hold circuit 12 of the second hierarchy K2 operates (tracks and holds) according to one of second clock signals of the second frequency supplied from the timing controller 60. The one of the second clock signals inputs to the track hold circuit 12 from the clock signal input terminal CLK2 via the clock buffer 37.

The track hold circuit 13 of the second hierarchy K2 operates (tracks and holds) according to the other second clock signal of the second frequency supplied from the timing controller 60. The other second clock signal inputs to the track hold circuit 13 from the clock signal input terminal CLK3 via the clock buffer 38.

Note here that the phases of the one of the second clock signals and the other second clock signal are shifted by $\pi$, for example, in a period of the second frequency in order to operate the track hold circuit 12 and the track hold circuit 13 with the time interleave system within the second hierarchy K2.

The track hold circuit 14 of the third hierarchy K3 operates (tracks and holds) according to one of upper third clock signals of the third frequency supplied from the timing controller 60. The one of the upper third clock signals inputs to the track hold circuit 14 from the clock signal input terminal CLK4 via the clock buffer 39.

The track hold circuit 15 of the third hierarchy K3 operates (tracks and holds) according to the other upper third clock signal of the third frequency supplied from the timing controller 60. The other upper third clock signal inputs to the track hold circuit 15 from the clock signal input terminal CLK5 via the clock buffer 40.

The track hold circuit 16 of the third hierarchy K3 operates (tracks and holds) according to one of lower third clock signals of the third frequency supplied from the timing controller 60. The one of the lower third clock signals inputs to the track hold circuit 16 from the clock signal input terminal CLK6 via the clock buffer 41.

The track hold circuit 17 of the third hierarchy K3 operates (tracks and holds) according to the other lower third clock signal of the third frequency supplied from the timing controller 60. The other lower third clock signal inputs to the track hold circuit 17 from the clock signal input terminal CLK7 via the clock buffer 42.

Note here that the phases of the one of the upper third clock signals and the other upper third clock signal are shifted by $(\pi/2)$, for example, in a period of the third frequency in order to operate the track hold circuit 14, the track hold circuit 15, the track hold circuit 16, and the track hold circuit 17 with the time interleave system within the third hierarchy K3. Further, the phases of the one of the upper third clock signals and the one of the lower third clock signals are shifted by $(\pi)$ for example, in a period of the third frequency. Furthermore, the phases of the one of the upper third clock signals and the other lower third clock signal are shifted by $(3\pi/2)$, for example, in a period of the third frequency.

The track hold circuit 18 of the fourth hierarchy K4 operates (tracks and holds) according to one of uppermost fourth clock signals of the fourth frequency supplied from the timing controller 60. The one of the uppermost fourth clock signals inputs to the track hold circuit 18 from the clock signal input terminal CLK8 via the clock buffer 43. The tracked and held analog value is outputted from the output terminal Sout11.

The track hold circuit 19 of the fourth hierarchy K4 operates (tracks and holds) according to the other uppermost fourth clock signal of the fourth frequency supplied from the timing controller 60. The other uppermost fourth clock signal inputs to the track hold circuit 19 from the clock signal input terminal CLK9 via the clock buffer 44. The tracked and held analog value is outputted from the output terminal Sout12.

The track hold circuit 20 of the fourth hierarchy K4 operates (tracks and holds) according to one of upper fourth clock signals of the fourth frequency supplied from the timing controller 60. The one of the upper fourth clock signals inputs to the track hold circuit 20 from the clock signal input terminal CLK10 via the clock buffer 45.

The tracked and held analog value is outputted from the output terminal Sout13.

The track hold circuit 21 of the fourth hierarchy K4 operates (tracks and holds) according to the other upper fourth clock signal of the fourth frequency supplied from the timing controller 60. The other upper fourth clock signal inputs to the track hold circuit 21 from the clock signal input terminal CLK11 via the clock buffer 46. The tracked and held analog value is outputted from the output terminal Sout14.

The track hold circuit 22 of the fourth hierarchy K4 operates (tracks and holds) according to one of lower fourth clock signals of the fourth frequency supplied from the timing controller 60. The one of the lower fourth clock signals inputs to the track hold circuit 22 from the clock signal input terminal CLK12 via the clock buffer 47. The tracked and held analog value is outputted from the output terminal Sout15.

The track hold circuit 23 of the fourth hierarchy K4 operates (tracks and holds) according to the other lower fourth clock signal of the fourth frequency supplied from the timing controller 60. The other lower fourth clock signal inputs to the track hold circuit 23 from the clock signal input terminal CLK13 via the clock buffer 48.

The tracked and held analog value is outputted from the output terminal Sout16.

The track hold circuit 24 of the fourth hierarchy K4 operates (tracks and holds) according to one of lowermost fourth clock signals of the fourth frequency supplied from the timing controller 60. The one of the lowermost fourth clock signals inputs to the track hold circuit 24 from the clock signal input terminal CLK14 via the clock buffer 49.

The tracked and held analog value is outputted from the output terminal Sout17.

The track hold circuit 25 of the fourth hierarchy K4 operates (tracks and holds) according to the other lowermost fourth clock signal of the fourth frequency supplied from the timing controller 60. The other lowermost fourth clock signal inputs to the track hold circuit 25 from the clock signal input terminal CLK15 via the clock buffer 50.

The tracked and held analog value is outputted from the output terminal Sout18.

Note here that the phases of the one of the uppermost fourth clock signals and the other uppermost fourth clock signal are shifted by $(\pi/4)$, for example, in a period of the fourth frequency in order to operate the track hold circuit 18, the track hold circuit 19, the track hold circuit 20, the track hold circuit 21, the track hold circuit 22, the track hold circuit 23, the track hold circuit 24, and the track hold circuit 25 with the time interleave system within the fourth hierarchy K4.

Further, the phases of the one of the uppermost fourth clock signals and the one of the upper fourth clock signals are shifted by ($\pi/2$), for example, in a period of the fourth frequency.

Furthermore, the phases of the one of the uppermost fourth clock signals and the other upper fourth clock signals are shifted by ($3\pi/4$), for example, in a period of the fourth frequency.

Moreover, the phases of the one of the uppermost fourth clock signals and one of the lower fourth clock signals are shifted by ($\pi$), for example, in a period of the fourth frequency.

Further, the phases of the one of the uppermost fourth clock signals and the other lower fourth clock signal are shifted by ($5\pi/4$), for example, in a period of the fourth frequency.

Furthermore, the phases of the one of the uppermost fourth clock signals and one of the lowermost fourth clock signals are shifted by ($3\pi/2$), for example, in a period of the fourth frequency.

Moreover, the phases of the one of the uppermost fourth clock signals and the other lowermost fourth clock signal are shifted by ($7\pi/4$), for example, in a period of the fourth frequency.

Note here that the track hold circuit module of the exemplary embodiment can form the track hold circuits capable of tracking and holding the analog values of the analog signals into a hierarchical tree structure.

Further, the control signal generation module supplies respective operation control signals to each of the track hold circuits of the hierarchical tree structure.

The hierarchical tree structure is a structure in which the number of the track hold circuits in each hierarchy gradually changes (e.g., increases) as the hierarchy increases from the first hierarchy on the input side to which the analog signal is inputted towards the final hierarchy on the final output side.

Further, the control signal generation module may have a first control function which controls the operation control signals in such a manner that each of the track hold circuits in each hierarchy operates at different frequencies.

Furthermore, the control signal generation module may have a second control function which controls the operation control signals in such a manner that each of the track hold circuits within each hierarchy operates in a time interleave manner.

(Regarding Operation Processing Procedure)
(Entire Schematic Operation)

Next, the entire operation processing procedure of the electronic circuit system having the above-described structure will be described by referring to FIG. 1-FIG. 3.

The overall operation processing procedure for conducting track and hold operations according to the exemplary embodiment is of the electronic circuits system which includes the track hold circuit module having the hierarchical tree structure constituted with the track hold circuits capable of tracking and holding the analog value of the analog signal and the control signal generation module which supplies the respective operation control signals to each of the track hold circuits, and it can be directed to such system which controls the operations of each of the track hold circuits.

The overall operation processing procedure of the track hold circuit module according to the exemplary embodiment includes the followings as the basic procedure. The control signal generation module functioning as a control signal generation device of the electronic circuit system inputs the analog signal from the first hierarchy on the input side of the hierarchical tree structure (a hierarchical tree structure input step), controls setting of each frequency of the respective operation control signals supplied to each of the track hold circuits for operating each of the track hold circuits, the number of which in the hierarchical tree structure changes (increases) gradually as the hierarchy increases towards the final hierarchy on the final output side, at different frequencies in each of the hierarchies (a frequency setting control step), controls generation of each of the operation control signals according to the number for operating each of the track hold circuits in a time interleave manner within the hierarchy (an operation control signal generation control step), and outputs each analog value from each of the output terminals of each of the track hold circuits of the final hierarchy of the hierarchical tree structure (a hierarchical tree structure output step).

(Detailed Operations)

Hereinafter, those operations will be described in details.
(Operation in First Hierarchy K1)

In the exemplary embodiment, as shown in FIG. 1, an analog signal inputted to the analog signal input terminal Sin is tracked and held by the track hold circuit (THA) 11 formed in the first hierarchy K1 (the first stage) based on a clock signal (a first clock signal) of a full rate clock (the first frequency) inputted from the clock signal input terminal CLK1 via the clock buffer 16.

Figure 3:
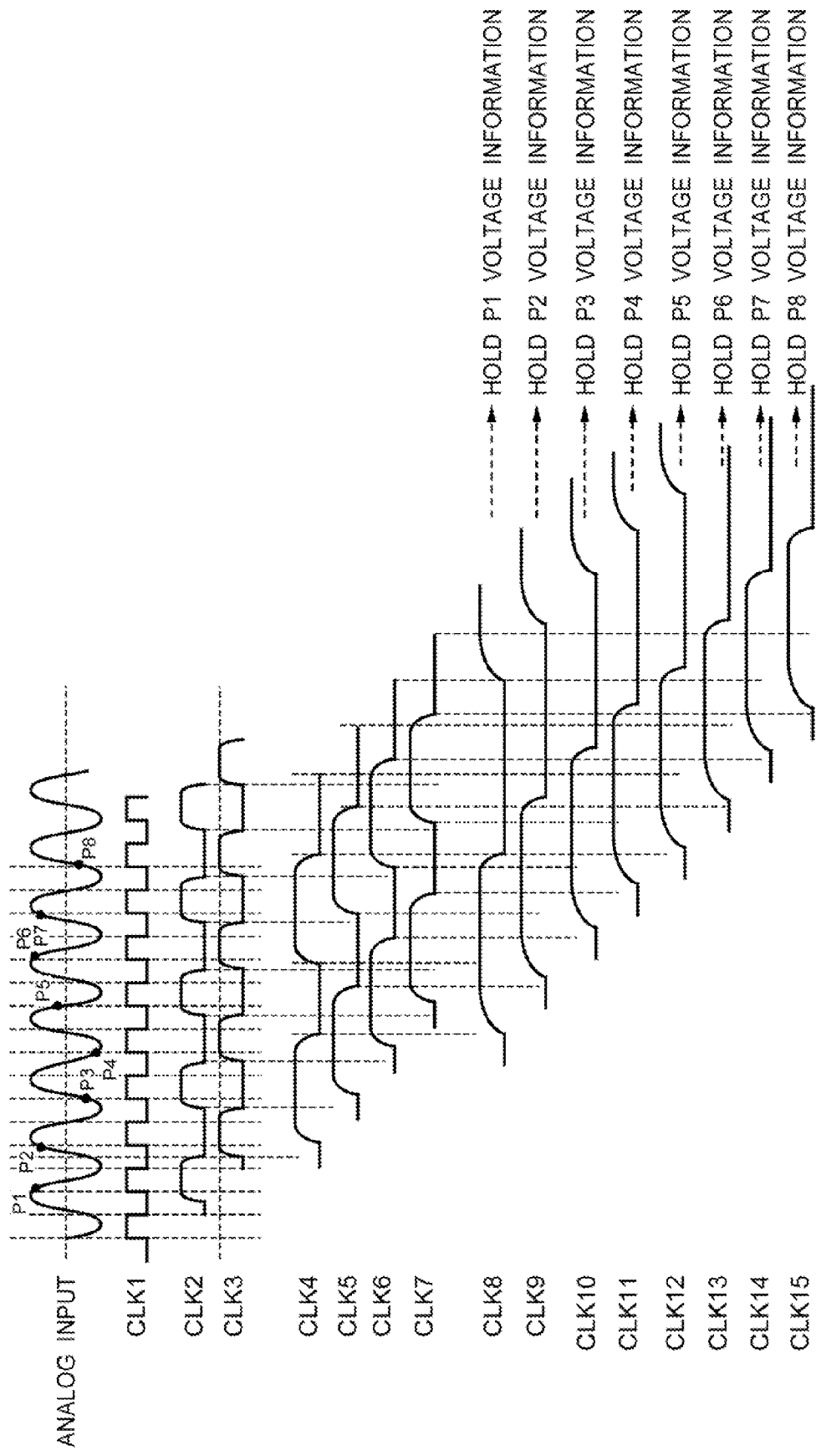
FIG. 3 is a timing chart showing an example of an operation processing procedure executed in the track hold circuit module shown in FIG. 1.

At this time, the relation between the analog signal inputted to the analog signal input terminal Sin and the signal (the first clock signal: signal corresponding to "CLK1" shown in FIG. 3) inputted to the clock signal input terminal CLK1 is as shown in the timing chart shown in FIG. 3, for example.

Returning to FIG. 1, the output of the track hold circuit 11 is branched into two and each of those is inputted to the interleave-operating track hold circuits (THAs) 12 and 13 formed in the second hierarchy K2 (the second stage).

(Operation in Second Hierarchy K2)

The track hold circuits (THAs) 12 and 13 in the second hierarchy K2 (the second stage) alternately track and hold two held signals that are held in the first hierarchy K1 (the first stage).

That is, the track hold circuits (THAs) 12 and 13 of the same hierarchy operate in a time interleave manner.

At the time of the time interleave operation, the track hold circuit 12 tracks and holds the signal that is held in the first hierarchy K1 based on the clock signal (one of the second clock signals) of the period (the second frequency) that is different from the full rate clock (the first frequency) inputted from the clock signal input terminal CLK2 via the clock buffer 37. The track hold circuit 13 tracks and holds the signal that is held in the first hierarchy K1 based on the clock signal (the other second clock signal) of the period (the second frequency) that is different from the full rate clock (the first frequency) inputted from the clock signal input terminal CLK3 via the clock buffer 38.

At this time, the phases of one of the second clock signals and the other second clock signal inputted, respectively, to the clock signal input terminal CLK2 and the clock signal input terminal 3 are shifted from each other as the clock signals shown in FIG. 3 (one of the second clock signals: a signal corresponding to "CLK2" shown in FIG. 3, the other second clock signal: a signal corresponding to "CLK3" shown in FIG. 3). Thereby, either a track and hold operation by one of the second clock signals (the signal corresponding to "CLK2") or a track and hold operation by the other second clock signal (the signal corresponding to "CLK3") is completed by the time interleave operation of the track hold circuits 12 and 13 during a term corresponding to two holdings (two periods) of the first clock signal (the signal corresponding to "CLK1") shown in FIG. 3.

Returning to FIG. 1, the output of the track hold circuit (THA) 12 is further branched into two and each of those is inputted to the track hold circuits (THAs) 14 and 15 formed in the third hierarchy K3 (the third stage).

Similarly, the output of the track hold circuit (THA) 13 is further branched into two and each of those is inputted to the track hold circuits (THAs) 16 and 17 formed in the third hierarchy K3 (the third stage).

That is, four systems in total are outputted from the second hierarchy K2 and inputted to each of the track hold circuits (THAs) 14, 15, 16, and 17 formed in the third hierarchy K3.

(Operation in Third Hierarchy K3)

The four track hold circuits (THAs) 14, 15, 16, and 17 of the third hierarchy K3 (the third stage) sequentially track and hold a total of four holdings of the four-system signals held in the second hierarchy K2 (the second stage).

That is, the track hold circuits (THAs) 14, 15, 16, and 17 of the same hierarchy operate in a time interleave manner.

At the time of the time interleave operation, the track hold circuit 14 tracks and holds the signal that is held in the second hierarchy K2 based on the clock signal (one of upper third clock signals) of the frequency (the third frequency) that is different from the full rate clock (the first frequency) inputted from the clock signal input terminal CLK4 via the clock buffer 39 and different from the second frequency.

The track hold circuit 15 tracks and holds the signal that is held in the second hierarchy K2 based on the clock signal (the other upper third clock signal) of the frequency (the third frequency) that is different from the full rate clock (the first frequency) inputted from the clock signal input terminal CLK5 via the clock buffer 40 and different from the second frequency.

The track hold circuit 16 tracks and holds the signal that is held in the second hierarchy K2 based on the clock signal (one of the lower third clock signals) of the frequency (the third frequency) that is different from the full rate clock (the first frequency) inputted from the clock signal input terminal CLK6 via the clock buffer 41 and different from the second frequency.

The track hold circuit 17 tracks and holds the signal that is held in the second hierarchy K2 based on the clock signal (the other lower third clock signal) of the frequency (the third frequency) that is different from the full rate clock (the first frequency) inputted from the clock signal input terminal CLK7 via the clock buffer 42 and different from the second frequency.

At this time, the phases of one of the upper third clock signals and the other upper third clock signal as well as one of the lower third clock signals and the other lower clock signal inputted, respectively, to the clock signal input terminals CLK4, CLK5, CLK6, and CLK7 are shifted from each other as the clock signals shown in FIG. 3 (one of the upper third clock signals: a signal corresponding to "CLK4" shown in FIG. 3, the other upper third clock signal: a signal corresponding to "CLK5" shown in FIG. 3, one of the lower third clock signals: a signal corresponding to "CLK6" shown in FIG. 3, the other lower third clock signal: a signal corresponding to "CLK7" shown in FIG. 3).

Thereby, a track and hold operation by one of the upper third clock signals (the signal corresponding to "CLK4"), a track and hold operation by the other upper third clock signal (the signal corresponding to "CLK5"), a track and hold operation by one of the lower third clock signals (the signal corresponding to "CLK6"), or a track and hold operation by the other lower third clock signal (the signal corresponding to "CLK7") is completed by the time interleave operation of the track hold circuits 14, 15, 16, and 17 during a term corresponding to two holdings (two periods) of the second clock signals (the signals corresponding to "CLK2, "CLK3") shown in FIG. 3 and corresponding to four holdings (four periods) of the first clock signal (the signal corresponding to "CLK1").

Returning to FIG. 1, the output of one of the upper track hold circuits (THAs), i.e., 14, is further branched into two and each of those is inputted to the track hold circuits (THAs) 18 and 19 formed in the fourth hierarchy K4 (the fourth stage).

Similarly, the output of the other upper track hold circuit (THA) 15 is further branched into two and each of those is inputted to the track hold circuits (THAs) 20 and 21 formed in the fourth hierarchy K4 (the fourth stage).

Similarly, the output of one of the lower track hold circuits (THAs), i.e., 16, is further branched into two and each of those is inputted to the track hold circuits (THAs) 22 and 23 formed in the fourth hierarchy K4 (the fourth stage).

Similarly, the output of the other lower track hold circuit (THA) 17 is further branched into two and each of those is inputted to the track hold circuits (THAs) 24 and 25 formed in the fourth hierarchy K4 (the fourth stage).

That is, eight systems in total are outputted from the third hierarchy K3 and inputted to each of the track hold circuits (THAs) 18, 19, 20, 21, 22, 23, 24, and 25 formed in the fourth hierarchy K4.

(Operation in Fourth Hierarchy K4)

The eight track hold circuits (THAs) 18, 19, 20, 21, 22, 23, 24, and 25 of the fourth hierarchy K4 (the fourth stage) sequentially track and hold a total of eight holdings of the eight-system signals held in the third hierarchy K3 (the third stage).

That is, the track hold circuits (THAs) 18, 19, 20, 21, 22, 23, 24, and 25 of the same hierarchy operate in a time interleave manner.

At the time of the time interleave operation, one of the uppermost track hold circuits, i.e., 18, tracks and holds the signal that is held by the track hold circuit 14 of the third hierarchy K3 based on the clock signal (one of the uppermost fourth clock signals) of the frequency (the fourth frequency) that is different from the full rate clock (the first frequency) inputted from the clock signal input terminal CLK8 via the clock buffer 43, different from the second frequency, and different from the third frequency.

The other uppermost track hold circuit 19 tracks and holds the signal that is held by the track hold circuit 14 of the third hierarchy K3 based on the clock signal (the other uppermost fourth clock signals) of the frequency (the fourth frequency) that is different from the full rate clock (the first frequency) inputted from the clock signal input terminal CLK9 via the clock buffer 44, different from the second frequency, and different from the third frequency.

One of the upper track hold circuits, i.e., 20, tracks and holds the signal that is held by the track hold circuit 15 of the third hierarchy K3 based on the clock signal (one of the upper fourth clock signals) of the frequency (the fourth frequency) that is different from the full rate clock (the first frequency) inputted from the clock signal input terminal CLK10 via the clock buffer 45, different from the second frequency, and different from the third frequency.

The other upper track hold circuit 21 tracks and holds the signal that is held by the track hold circuit 15 of the third hierarchy K3 based on the clock signal (one of the lower fourth clock signals) of the frequency (the fourth frequency) that is different from the full rate clock (the first frequency) inputted from the clock signal input terminal CLK11 via the clock buffer 46, different from the second frequency, and different from the third frequency.

One of the lower track hold circuits, i.e., 22, tracks and holds the signal that is held by the track hold circuit 16 of the third hierarchy K3 based on the clock signal (one of lower fourth clock signals) of the frequency (the fourth frequency) that is different from the full rate clock (the first frequency) inputted from the clock signal input terminal CLK12 via the clock buffer 47, different from the second frequency, and different from the third frequency. The other lower track hold circuit 23 tracks and holds the signal that is held by the track hold circuit 16 of the third hierarchy K3 based on the clock signal (the other lower fourth clock signal) of the frequency (the fourth frequency) that is different from the full rate clock (the first frequency) inputted from the clock signal input terminal CLK13 via the clock buffer 48, different from the second frequency, and different from the third frequency.

One of the lowermost track hold circuits, i.e., 24, tracks and holds the signal that is held by the track hold circuit 17 of the third hierarchy K3 based on the clock signal (one of lowermost fourth clock signals) of the frequency (the fourth frequency) that is different from the full rate clock (the first frequency) inputted from the clock signal input terminal CLK14 via the clock buffer 49, different from the second frequency, and different from the third frequency. The other lowermost track hold circuit 25 tracks and holds the signal that is held by the track hold circuit 17 of the third hierarchy K3 based on the clock signal (the other lowermost fourth clock signal) of the frequency (the fourth frequency) that is different from the full rate clock (the first frequency) inputted from the clock signal input terminal CLK15 via the clock buffer 50, different from the second frequency, and different from the third frequency.

At this time, the phases of one of the uppermost fourth clock signals and the other uppermost fourth clock signal, one of the upper fourth clock signals and the other upper fourth clock signal, one of the lower fourth clock signals and the other lower fourth clock signal, and one of the lowermost fourth clock signal and the other lowermost fourth clock signal inputted, respectively, to the clock signal input terminals CLK8, CLK9, CLK10, CLK11, CLK12, CLK13, CLK14, and CLK15 are shifted from each other as the clock signals shown in FIG. 3 (one of the uppermost fourth clock signals: a signal corresponding to "CLK8" shown in FIG. 3, the other uppermost fourth clock signal: a signal corresponding to "CLK9" shown in FIG. 3, one of the upper fourth clock signals: a signal corresponding to "CLK10" shown in FIG. 3, the other upper fourth clock signal: a signal corresponding to "CLK11" shown in FIG. 3, one of the lower fourth clock signals: a signal corresponding to "CLK12" shown in FIG. 3, the other lower fourth clock signal: a signal corresponding to "CLK13" shown in FIG. 3, one of the lowermost fourth clock signals: a signal corresponding to "CLK14" shown in FIG. 3, the other lowermost fourth clock signal: a signal corresponding to "CLK15" shown in FIG. 3). Thereby, a track and hold operation by one of the uppermost fourth clock signals (the signal corresponding to "CLK8"), a track and hold operation by the other uppermost fourth clock signal (the signal corresponding to "CLK9"), a track and hold operation by one of the upper fourth clock signals (the signal corresponding to "CLK10"), a track and hold operation by the other upper fourth clock signal (the signal corresponding to "CLK11"), a track and hold operation by one of the lower fourth clock signals (the signal corresponding to "CLK12"), a track and hold operation by the other lower fourth clock signal (the signal corresponding to "CLK13"), a track and hold operation by one of the lowermost fourth clock signals (the signal corresponding to "CLK14"), or a track and hold operation by the other lowermost fourth clock signal (the signal corresponding to "CLK15") is completed by the time interleave operation of the track hold circuits 18, 19, 20, 21, 22, 23, 24, and 25 during a term corresponding to two holdings (two periods) of the third clock signals (the signals corresponding to "CLK4, "CLK5", "CLK6", "CLK7") shown in FIG. 3, corresponding to four holdings (four periods) of the second clock signals (the signal corresponding to "CLK2", "CLK3"), and corresponding to eight holdings (eight periods) of the first clock signal (the signal corresponding to "CLK1").

Returning to FIG. 1, signals are outputted from sixteen systems in total from the fourth hierarchy K4.

That is, from the track hold circuits (THA) 18, 19, 20, 21, 22, 23, 24, and 25 formed in the fourth hierarchy K4, the signals tracked and held in eight different phases carrying information of eight different analog values are outputted from the output terminals Sout11, Sout12, Sout13, Sout14, Sout15, Sout16, Sout17, and Sout18.

While the exemplary embodiment is described by referring to the case where the hierarchical tree structure is formed with four layers (four stages), the tree structure does not necessarily have to be in four layers. It is possible to increase the number of layers (the number of stages) according to the required resolution and to change the number of outputs by increasing the branching number in each layer (each stage).

With the exemplary embodiment as described above, the power consumed in each hierarchical stage of the time-interleave track hold circuits can be used in a highly efficient manner through forming the track hold circuits in a hierarchical tree structure. Therefore, it is possible to suppress the power consumption compared to the time-interleave track hold circuits of the related technique in terms of the entire power consumption.

That is, in a case where the circuits are formed in a hierarchical tree structure, the frequency of the clock signal supplied to each hierarchy is decreased in order, for example, to lower the speed of the frequency component of the signal of each system every time the stage increases to acquire the desired number of outputs.

As in this structure, through decreasing the rate of the signal to be processed, for example, in order every time the tree is branched, the power consumption of the track hold circuits required in each stage can be suppressed. As a result, the power consumption of the track hold circuits operating in the time interleave manner can be reduced.

Further, it is capable of making it easy to save the power and to adjust the skew timing.

Note here that each block (e.g., the control signal generation module) of the block diagram shown in FIG. 2 may be a software module structure showing a state being functionalized by a program that can be executed by a computer.

That is, while the physical structure is a single CPU or a plurality of CPUs and the like (a single CPU or a plurality of CPUs and a single memory or a plurality of memories), the software structures formed by each section (circuit, means) are a plurality of functions achieved by the CPU by controls of the program expressed respectively as structural elements formed by the plurality of sections (means).

When the dynamic state where the CPU is executed by the program (a state where each procedure constituting the program is being executed) is functionally expressed, each section (means) is formed within the CPU. In a static state where the program is not executed, the entire program for achieving the structures of each means (or each part of the program contained in the strictures of each means) is stored in a storage region such as a memory.

Each section (means) described above may be structured through forming a computer functionalized by a program to be executed along with the functions of the program or formed with a device constituted with a plurality of electronic circuit blocks functionalized permanently by specific hardware. Therefore, those functional blocks can be achieved by various forms such as only with hardware, only with software, or a combination of those, but not limited only to any of those.

Second Exemplary Embodiment

Next, a second exemplary embodiment of the invention will be described. Hereinafter, explanations regarding substantially the same structure as that of the first exemplary embodiment are omitted, and only the different points are to be described.

In the first exemplary embodiment described above, the first clock signal (the clock signal inputted to CLK1), the second clock signal (the clock signals inputted to CLK2, CLK3), the third clock signal (the clock signal inputted to CLK4, CLK5, CLK6, CLK7), and the fourth clock signal (the clock signals inputted to CLK8, CLK9, CLK10, CLK11, CLK12, CLK13, CLK14, CLK15) are set to be of different frequencies (periods) from each other.

In the meantime, in the second exemplary embodiment, the second frequency of the second clock signal can be set to be lower (longer period) than the first frequency of the first clock signal.

Further, the third frequency of the third clock signal can be set to be lower (longer period) than the second frequency of the second clock signal.

Furthermore, the fourth frequency of the fourth clock signal can be set to be lower (longer period) than the third frequency of the third clock signal.

Specifically, referring to FIG. 1 that is also used for describing the first exemplary embodiment, the track hold circuits 12 and 13 perform track and hold actions based on a signal longer than a period of full rate clock inputted from the clock signal input terminals CLK2, CLK3 via the clock buffers 37, 38.

The track hold circuits 14, 15, 16, and 17 perform track and hold actions based on a signal longer than a period of the clock inputted to the track hold circuits 12 and 13, which is the signal inputted from the clock signal input terminals CLK4, CLK5, CLK6, CLK7 via the clock buffers 39, 40, 41, 42.

The track hold circuits 18, 19, 20, 21, 22, 23, 24, and 25 perform track and hold actions based on a signal longer than a period of the clock inputted to the track hold circuits 14, 15, 16, and 17, which is the signal inputted from the clock signal input terminals CLK8, CLK9, CLK10, CLK11, CLK12, CLK13, CLK14, CLK15 via the clock buffers 43, 44, 45, 46, 47, 48, 49, 50.

The control signal generation module may include a first control function which controls the operation control signals in such a manner that each of the track hold circuits in each hierarchy operates at different frequencies. In this case, the first control function may include a function which controls the operation control signals to decrease the frequency in order as the number of hierarchy increases from the first hierarchy towards the final hierarchy.

Further, when the control signal generation module functioning as a control signal generation device in the electronic circuit system in the operation control procedure controls to set each of the frequencies, it is possible to perform controls to set the frequency to decrease in order as the hierarchy increases from the first hierarchy towards the final hierarchy.

As described above, it is possible with the second exemplary embodiment to lower the power consumption further while keeping the same operation effects as the case of the first exemplary embodiment.

That is, the track hold circuit module according to one exemplary embodiment of the present invention is formed as a tree structure constituted with a plurality of hierarchies (stages) of track hold circuits having the analog signal input terminal as a root, in which: a signal inputted from the analog signal input terminal inputs to the track hold circuit; the outputs thereof are branched into an arbitrary number; and the signal is outputted to the track hold circuit group of a next hierarchy (stage). The frequency of the clock signal supplied to each hierarchy is decreased in order, so that the frequency component of the signal of each system is lowered in speed every time the hierarchy increases and a desired number of outputs can be acquired.

As in this structure, through decreasing the rate of the signal to be processed in order every time the tree structure is branched, the power consumption of the track hold circuits required in each stage can be suppressed. As a result, the power consumption of the track hold circuits employing the time interleave system can be decreased.

The aforementioned effect can be described in more details as follows. For example, in a case where it is assumed that the power consumption becomes a half in proportion to the rate of the processed signal required for the single track hold circuit, an acquired result is as follows. Here, assumed is a case where the power consumption of the track hold circuit of the first hierarchy (the first stage) is 2 mW.

Related Technique: 2 mW+(1 mW×8)=10 mW

New: 2 mW+(1 mW×2)+(0.5 mW×4)+(0.25 mW×8)=8 mW

In addition to the effect of saving the power described above, clock phase adjustment becomes easy since the clock signals of eight phases as in the related technique become unnecessary in the track hold circuits of the second stage but only the clock signals of two phases are required.

Thereby, there is also an effect of making it easy to adjust the skew timing (FIG. 3). Further, there is a sufficient time for the rise of the clock, so that the power consumption of the clock buffer can be reduced.

Other structures and other steps as well as the functions and working effects thereof are the same as the case of the exemplary embodiment described above. Further, the operation contents of each step and structural elements of each section as well as each function thereof in the explanations above may be put into a program (software program) to be executed by a computer.

Third Exemplary Embodiment

Next, a third exemplary embodiment of the invention will be described by referring to FIG. 4. Hereinafter, explanations regarding substantially the same structure as that of the first exemplary embodiment are omitted, and only the different points are to be described. FIG. 4 is a circuit diagram showing an example of a detailed structure of a track hold circuit module in an electronic circuit system according to the third exemplary embodiment of the invention.

The third exemplary embodiment is different from the first exemplary embodiment in respect that the first hierarchy is formed with two track hold circuits, the second hierarchy is formed with four track hold circuits, and the third hierarchy is formed with eight track hold circuits.

Specifically, as shown in FIG. 4, a track hold circuit module 110 of the exemplary embodiment has a hierarchical tree structure (a branching structure), and the hierarchical tree structure has a three-stage hierarchical structure with the first hierarchy K1, the second hierarchy K2, and the third hierarchy K3.

Further, the track hold circuit module 110 includes: a single analog signal input terminal Sin; two track hold circuit (THAs) 12, 13, which are formed in the first hierarchy (the first stage) K1 and operate at the second frequency; four track hold circuits (THAs) 14-17 which are formed in the second hierarchy (the second stage) K2 and operate at the third frequency; eight track hold circuits (THAs) 18-25 which are formed in the third hierarchy (the third stage) K3 and operate at the fourth frequency; output terminals Sout11-Sout18 of the tracked and held signals; clock buffers 36-50 as clock signal temporary holding sections; and clock signal input terminals CLK1-CLK15.

The hierarchical tree structure of the track hold circuit module 10 is formed to be vertically symmetric in each hierarchy, and formed to be operable with a time interleave system in each hierarchy.

In the hierarchical tree structure, the tree is branched at a first branch point by a branching number of "2" to form the first hierarchy K1 with each of the first hierarchy branches by taking the analog signal input terminal Sin as a root.

Further, in the hierarchical tree structure, the tree is branched at an upper second branch point by a branching number of "2" from one of the first hierarchy branches to form a part of the second hierarchy K2 with each of the upper second hierarchy branches. Similarly, in the hierarchical tree structure, the tree is branched at a lower second branch point by a branching number of "2" from the other first hierarchy branch to form a part of the second hierarchy K2 with each of the lower second hierarchy branches.

Furthermore, in the hierarchical tree structure, the tree is branched at an uppermost third branch point by a branching number of "2" from one of the upper second hierarchy branches to form a part of the third hierarchy K3 with each of the uppermost third hierarchy branches. Similarly, in the hierarchical tree structure, the tree is branched at an upper third branch point by a branching number of "2" from the other upper second hierarchy branch to form a part of the third hierarchy K3 with each of the upper third hierarchy branches. Similarly, in the hierarchical tree structure, the tree is branched at the lower third branch points by a branching number of "2" from one of the lower second hierarchy branches to form a part of the third hierarchy K3 with each of the lower third hierarchy branches. Similarly, in the hierarchical tree structure, the tree is branched at a lowermost third branch point by a branching number of "2" from the other lower second hierarchy branch to form a part of the third hierarchy K3 with each of the lowermost third hierarchy branches.

In the exemplary embodiment, the second frequency, the third frequency, and the fourth frequency are different from each other. Further, there is no circuit which operates with the first frequency (full rate clock) like the case of the first exemplary embodiment.

The track hold circuit 12 of the first hierarchy K1 operates (tracks and holds) according to one of the second clock signals of the second frequency supplied from a timing controller 160. The one of the second clock signals inputs to the track hold circuit 12 from the clock signal input terminal CLK2 via the clock buffer 37.

The track hold circuit 13 of the first hierarchy K1 operates (tracks and holds) according to the other second clock signal of the second frequency supplied from the timing controller 160. The other second clock signal inputs to the track hold circuit 13 from the clock signal input terminal CLK3 via the clock buffer 38.

Note here that the phases of the one of the second clock signals and the other second clock signal are shifted by $\pi$, for example, in a period of the second frequency in order to operate the track hold circuit 12 and the track hold circuit 13 with the time interleave system within the second hierarchy K2.

The track hold circuit 14 of the second hierarchy K2 operates (tracks and holds) according to one of upper third clock signals of the third frequency supplied from the timing controller 160. The one of the upper third clock signals inputs to the track hold circuit 14 from the clock signal input terminal CLK4 via the clock buffer 39.

The track hold circuit 15 of the second hierarchy K2 operates (tracks and holds) according to the other upper third clock signal of the third frequency supplied from the timing controller 160. The other upper third clock signal inputs to the track hold circuit 15 from the clock signal input terminal CLK5 via the clock buffer 40.

The track hold circuit 16 of the second hierarchy K2 operates (tracks and holds) according to one of lower third clock signals of the third frequency supplied from the timing controller 160. The one of the lower third clock signals inputs to the track hold circuit 16 from the clock signal input terminal CLK6 via the clock buffer 41.

The track hold circuit 17 of the second hierarchy K2 operates (tracks and holds) according to the other lower third clock signal of the third frequency supplied from the timing controller 160. The other lower third clock signal inputs to the track hold circuit 17 from the clock signal input terminal CLK7 via the clock buffer 42.

Note here that the phases of the one of the upper third clock signals and the other third clock signal are shifted by ($\pi/2$), for example, in a period of the third frequency in order to operate the track hold circuit 14, the track hold circuit 15, the track hold circuit 16, and the track hold circuit 17 with the time interleave system within the second hierarchy K2.

Further, the phases of the one of the upper third clock signals and the one of the lower third clock signals are shifted by ($\pi$) for example, in a period of the third frequency.

Furthermore, the phases of the one of the upper third clock signals and the other lower third clock signal are shifted by ($3\pi/2$), for example, in a period of the third frequency.

The track hold circuit 18 of the third hierarchy K3 operates (tracks and holds) according to one of the uppermost fourth clock signals of the fourth frequency supplied from the timing controller 160. The one of the uppermost fourth clock signals inputs to the track hold circuit 18 from the clock signal input terminal CLK8 via the clock buffer 43.

The tracked and held analog value is outputted from the output terminal Sout11.

The track hold circuit 19 of the third hierarchy K3 operates (tracks and holds) according to the other uppermost fourth clock signal of the fourth frequency supplied from the timing controller 160. The other uppermost fourth clock signal inputs to the track hold circuit 19 from the clock signal input terminal CLK9 via the clock buffer 44.

The tracked and held analog value is outputted from the output terminal Sout12.

The track hold circuit 20 of the third hierarchy K3 operates (tracks and holds) according to one of upper fourth clock signals of the fourth frequency supplied from the timing controller 160. The one of the upper fourth clock signals inputs to the track hold circuit 20 from the clock signal input terminal CLK10 via the clock buffer 45.

The tracked and held analog value is outputted from the output terminal Sout13.

The track hold circuit 21 of the third hierarchy K3 operates (tracks and holds) according to the other upper fourth clock signal of the fourth frequency supplied from the timing controller 160. The other upper fourth clock signal inputs to the track hold circuit 21 from the clock signal input terminal CLK11 via the clock buffer 46.

The tracked and held analog value is outputted from the output terminal Sout14.

The track hold circuit 22 of the third hierarchy K3 operates (tracks and holds) according to one of the lower fourth clock signals of the fourth frequency supplied from the timing controller 160. The one of the lower fourth clock signals inputs to the track hold circuit 22 from the clock signal input terminal CLK12 via the clock buffer 47.

The tracked and held analog value is outputted from the output terminal Sout15.

The track hold circuit 23 of the third hierarchy K3 operates (tracks and holds) according to the other lower fourth clock signal of the fourth frequency supplied from the timing controller 160. The other lower fourth clock signal inputs to the track hold circuit 23 from the clock signal input terminal CLK13 via the clock buffer 48.

The tracked and held analog value is outputted from the output terminal Sout16.

The track hold circuit 24 of the third hierarchy K3 operates (tracks and holds) according to one of the lowermost fourth clock signals of the fourth frequency supplied from the timing controller 160. The one of the lowermost fourth clock signals inputs to the track hold circuit 24 from the clock signal input terminal CLK14 via the clock buffer 49.

The tracked and held analog value is outputted from the output terminal Sout17.

The track hold circuit 25 of the third hierarchy K3 operates (tracks and holds) according to the other lowermost fourth clock signal of the fourth frequency supplied from the timing controller 160. The other lowermost fourth clock signal inputs to the track hold circuit 25 from the clock signal input terminal CLK15 via the clock buffer 50.

The tracked and held analog value is outputted from the output terminal Sout18.

Note here that the phases of the one of the uppermost fourth clock signals and the other uppermost fourth clock signal are shifted by ($\pi/4$), for example, in a period of the fourth frequency in order to operate the track hold circuit 18, the track hold circuit 19, the track hold circuit 20, the track hold circuit 21, the track hold circuit 22, the track hold circuit 23, the track hold circuit 24, and the track hold circuit 25 with the time interleave system within the third hierarchy K3.

Further, the phases of the one of the uppermost fourth clock signals and the one of the upper fourth clock signals are shifted by ($\pi/2$), for example, in a period of the fourth frequency.

Furthermore, the phases of the one of the uppermost fourth clock signals and the other upper fourth clock signal are shifted by ($3\pi/4$), for example, in a period of the fourth frequency.

Moreover, the phases of the one of the uppermost fourth clock signals and the one of the lower fourth clock signals are shifted by ($\pi$), for example, in a period of the fourth frequency.

Further, the phases of the one of the upper fourth clock signals and the other lower fourth clock signal are shifted by ($5\pi/4$), for example, in a period of the fourth frequency.

Furthermore, the phases of the one of the uppermost fourth clock signals and one of the lowermost fourth clock signals are shifted by ($3\pi/2$), for example, in a period of the fourth frequency.

Moreover, the phases of the one of the uppermost fourth clock signals and the other lowermost fourth clock signal are shifted by ($7\pi/4$), for example, in a period of the fourth frequency.

Note here that the hierarchical tree structure may be a structure including at least two branched track hold circuits in the first hierarchy, and the number of the track hold circuits increases gradually in each hierarchy thereafter.

(Regarding Operation Control Procedure)

Note here that the hierarchical tree structure in this exemplary embodiment is a structure including at least two branched track hold circuits in the first hierarchy, and the number of the track hold circuits increases gradually in each hierarchy thereafter.

In this case, when the control signal generation module functioning as the control signal generation device of the electronic circuit system in the operation control procedure controls to set each of the frequency, it is possible to control to set the frequencies according to the hierarchical tree structure and to control to change the frequency from the full rate also in the first hierarchy.

Further, when controlling generation of each of the control signals in the operation control procedure, it is possible to control generation of the operation control signals according to the hierarchical structure and to control generation of each of the operation control signals also in the first hierarchy for operating each of the track hold circuits in a time interleave manner.

This will be described in details.

(Operation in First Hierarchy K1)

In the exemplary embodiment, as shown in FIG. 4, an analog signal inputted to the analog signal input terminal Sin is divided into two and inputted to the interleave-operating track hold circuits (THAs) 12 and 13 formed in the first hierarchy K1 (the first stage), respectively. The two track hold circuits (THAs) 12 and 13 in the first hierarchy K1 (the first stage) alternately track and hold the analog signals.

That is, the track hold circuits (THAs) 12 and 13 of the same hierarchy operate in a time interleave manner.

At the time of the time interleave operation, the track hold circuit 12 tracks and holds the analog signal based on the clock signal (one of the second clock signals) of the period (the second frequency) that is different from the full rate clock (the first frequency) inputted from the clock signal input terminal CLK2 via the clock buffer 37.

The track hold circuit 13 tracks and holds the analog signal based on the clock signal (the other second clock signal) of the period (the second frequency) that is different from the full rate clock (the first frequency) inputted from the clock signal input terminal CLK3 via the clock buffer 38.

At this time, the phases of one of the second clock signals and the other second clock signal inputted, respectively, to the clock signal input terminal CLK2 and the clock signal input terminal 3 are shifted from each other as the clock signals shown in FIG. 3 (one of the second clock signals: a signal corresponding to "CLK2" shown in FIG. 3, the other second clock signal: a signal corresponding to "CLK3" shown in FIG. 3).

Thereby, either a track and hold operation by one of the second clock signals (the signal corresponding to "CLK2") or a track and hold operation by the other second clock signal (the signal corresponding to "CLK3") is completed in a specific period by the time interleave operation of the track hold circuits 12 and 13.

Returning to FIG. 4, the output of the track hold circuit (THA) 12 is further branched into two and each of those is inputted to the track hold circuits (THAs) 14 and 15 formed in the second hierarchy K2 (the second stage).

Similarly, the output of the track hold circuit (THA) 13 is further branched into two and each of those is inputted to the track hold circuits (THAs) 16 and 17 formed in the second hierarchy K2 (the second stage).

That is, four systems in total are outputted from the first hierarchy K1 and inputted to each of the track hold circuits (THAs) 14, 15, 16, and 17 formed in the second hierarchy K2.

(Operation in Second Hierarchy K2)

The four track hold circuits (THAs) 14, 15, 16, and 17 of the second hierarchy K2 (the second stage) sequentially track and hold a total of four holdings of the four-system signals held in the first hierarchy K2 (the first stage).

That is, the track hold circuits (THAs) 14, 15, 16, and 17 of the same hierarchy operate in a time interleave manner.

At the time of the time interleave operation, the track hold circuit 14 tracks and holds the signal that is held in the first hierarchy K1 based on the clock signal (one of the upper third clock signals) of the frequency (the third frequency) that is different from the full rate clock (the first frequency) inputted from the clock signal input terminal CLK4 via the clock buffer 39 and different from the second frequency.

The track hold circuit 15 tracks and holds the signal that is held in the first hierarchy K1 based on the clock signal (the other upper third clock signal) of the frequency (the third frequency) that is different from the full rate clock (the first frequency) inputted from the clock signal input terminal CLK5 via the clock buffer 40 and different from the second frequency.

The track hold circuit 16 tracks and holds the signal that is held in the first hierarchy K1 based on the clock signal (one of the lower third clock signals) of the frequency (the third frequency) that is different from the full rate clock (the first frequency) inputted from the clock signal input terminal CLK6 via the clock buffer 41 and different from the second frequency.

The track hold circuit 17 tracks and holds the signal that is held in the first hierarchy K1 based on the clock signal (the other lower third clock signal) of the frequency (the third frequency) that is different from the full rate clock (the first frequency) inputted from the clock signal input terminal CLK7 via the clock buffer 42 and different from the second frequency.

At this time, the phases of one of the upper third clock signals and the other upper third clock signal as well as one of the lower third clock signals and the other lower clock signal inputted, respectively, to the clock signal input terminals CLK4, CLK5, CLK6, and CLK7 are shifted from each other as the clock signals shown in FIG. 3 (one of the upper third clock signals: a signal corresponding to "CLK4" shown in FIG. 3, the other upper third clock signal: a signal corresponding to "CLK5" shown in FIG. 3, one of the lower third clock signals: a signal corresponding to "CLK6" shown in FIG. 3, the other lower third clock signal: a signal corresponding to "CLK7" shown in FIG. 3).

Thereby, a track and hold operation by one of the upper third clock signals (the signal corresponding to "CLK4"), a track and hold operation by the other upper third clock signal (the signal corresponding to "CLK5"), a track and hold operation by one of the lower third clock signals (the signal corresponding to "CLK6"), or a track and hold operation by the other lower third clock signal (the signal corresponding to "CLK7") is completed by the time interleave operation of the track hold circuits 14, 15, 16, and 17 during a term corresponding to two holdings (two periods) of the second clock signals (the signals corresponding to "CLK2, "CLK3") shown in FIG. 3.

Returning to FIG. 4, the output of one of the upper track hold circuits (THAs), i.e., 14, is further branched into two and each of those is inputted to the track hold circuits (THAs) 18 and 19 formed in the third hierarchy K3 (the third stage).

Similarly, the output of the other upper track hold circuit (THA) 15 is further branched into two and each of those is inputted to the track hold circuits (THAs) 20 and 21 formed in the third hierarchy K3 (the third stage).

Similarly, the output of one of the lower track hold circuits (THAs), i.e., 16, is further branched into two and each of those is inputted to the track hold circuits (THAs) 22 and 23 formed in the fourth hierarchy K3 (the third stage).

Similarly, the output of the other lower track hold circuit (THA) 17 is further branched into two and each of those is inputted to the track hold circuits (THAs) 24 and 25 formed in the third hierarchy K3 (the third stage).

That is, eight systems in total are outputted from the second hierarchy K2 and inputted to each of the track hold circuits (THAs) 18, 19, 20, 21, 22, 23, 24, and 25 formed in the third hierarchy K3.

(Operation in Third Hierarchy K3)

The eight track hold circuits (THAs) 18, 19, 20, 21, 22, 23, 24, and 25 of the third hierarchy K3 (the third stage) sequentially track and hold a total of eight holdings of the eight-system signals held in the second hierarchy K2 (the second stage).

That is, the track hold circuits (THAs) 18, 19, 20, 21, 22, 23, 24, and 25 of the same hierarchy operate in a time interleave manner.

At the time of the time interleave operation, one of the uppermost track hold circuits, i.e., 18, tracks and holds the signal that is held by the track hold circuit 14 of the second hierarchy K2 based on the clock signal (one of the uppermost fourth clock signals) of the frequency (the fourth frequency) that is different from the full rate clock (the first frequency) inputted from the clock signal input terminal CLK8 via the clock buffer 43, different from the second frequency, and different from the third frequency.

The other uppermost track hold circuit 19 tracks and holds the signal that is held by the track hold circuit 14 of the second hierarchy K2 based on the clock signal (the other uppermost fourth clock signals) of the frequency (the fourth frequency) that is different from the full rate clock (the first frequency) inputted from the clock signal input terminal CLK9 via the clock buffer 44, different from the second frequency, and different from the third frequency.

One of the upper track hold circuits, i.e., 20, tracks and holds the signal that is held by the track hold circuit 15 of the second hierarchy K2 based on the clock signal (one of the upper fourth clock signals) of the frequency (the fourth frequency) that is different from the full rate clock (the first frequency) inputted from the clock signal input terminal CLK10 via the clock buffer 45, different from the second frequency, and different from the third frequency.

The other upper track hold circuit 21 tracks and holds the signal that is held by the track hold circuit 15 of the second hierarchy K2 based on the clock signal (one of the lower fourth clock signals) of the frequency (the fourth frequency) that is different from the full rate clock (the first frequency) inputted from the clock signal input terminal CLK11 via the clock buffer 46, different from the second frequency, and different from the third frequency.

One of the lower track hold circuits, i.e., 22, tracks and holds the signal that is held by the track hold circuit 16 of the second hierarchy K2 based on the clock signal (one of the lower fourth clock signals) of the frequency (the fourth frequency) that is different from the full rate clock (the first frequency) inputted from the clock signal input terminal. CLK12 via the clock buffer 47, different from the second frequency, and different from the third frequency.

The other lower track hold circuit 23 tracks and holds the signal that is held by the track hold circuit 16 of the second hierarchy K2 based on the clock signal (the other lower fourth clock signal) of the frequency (the fourth frequency) that is different from the full rate clock (the first frequency) inputted from the clock signal input terminal CLK13 via the clock buffer 48, different from the second frequency, and different from the third frequency.

One of the lowermost track hold circuits, i.e., 24, tracks and holds the signal that is held by the track hold circuit 17 of the second hierarchy K2 based on the clock signal (one of the lowermost fourth clock signals) of the frequency (the fourth frequency) that is different from the full rate clock (the first frequency) inputted from the clock signal input terminal CLK14 via the clock buffer 49, different from the second frequency, and different from the third frequency.

The other lowermost track hold circuit 25 tracks and holds the signal that is held by the track hold circuit 17 of the second hierarchy K2 based on the clock signal (the other lowermost fourth clock signal) of the frequency (the fourth frequency) that is different from the full rate clock (the first frequency) inputted from the clock signal input terminal CLK15 via the clock buffer 50, different from the second frequency, and different from the third frequency.

At this time, the phases of one of the uppermost fourth clock signals and the other uppermost fourth clock signal, one of the upper fourth clock signals and the other upper fourth clock signal, one of the lower fourth clock signals and the other lower fourth clock signal, and one of the lowermost fourth clock signals and the other lowermost fourth clock signal inputted, respectively, to the clock signal input terminals CLK8, CLK9, CLK10, CLK11, CLK12, CLK13, CLK14, and CLK15 are shifted from each other as the clock signals shown in FIG. 3 (one of the uppermost fourth clock signals: a signal corresponding to "CLK8" shown in FIG. 3, the other uppermost fourth clock signal: a signal corresponding to "CLK9" shown in FIG. 3, one of the upper fourth clock signals: a signal corresponding to "CLK10" shown in FIG. 3, the other upper fourth clock signal: a signal corresponding to "CLK11" shown in FIG. 3, one of the lower fourth clock signals: a signal corresponding to "CLK12" shown in FIG. 3, the other lower fourth clock signal: a signal corresponding to "CLK13" shown in FIG. 3, one of the lowermost fourth clock signals: a signal corresponding to "CLK14" shown in FIG. 3, the other lowermost fourth clock signal: a signal corresponding to "CLK15" shown in FIG. 3).

Thereby, a track and hold operation by one of the uppermost fourth clock signals (the signal corresponding to "CLK8"), a track and hold operation by the other uppermost fourth clock signal (the signal corresponding to "CLK9"), a track and hold operation by one of the upper fourth clock signals (the signal corresponding to "CLK10"), a track and hold operation by the other upper fourth clock signal (the signal corresponding to "CLK11"), a track and hold operation by one of the lower fourth clock signals (the signal corresponding to "CLK12"), a track and hold operation by the other lower fourth clock signal (the signal corresponding to "CLK13"), a track and hold operation by one of the lowermost fourth clock signals (the signal corresponding to "CLK14"), or a track and hold operation by the other lowermost fourth clock signal (the signal corresponding to "CLK15") is completed by the time interleave operation of the track hold circuits 18, 19, 20, 21, 22, 23, 24, and 25 during a term corresponding to two holdings (two periods) of the third clock signals (the signals corresponding to "CLK4, CLK5", "CLK6", "CLK7") shown in FIG. 3 and corresponding to four holdings (four periods) of the second clock signal (the signal corresponding to "CLK2", "CLK3").

Returning to FIG. 4, signals are outputted from sixteen systems in total from the third hierarchy K3.

That is, from the track hold circuits (THA) 18, 19, 20, 21, 22, 23, 24, and 25 formed in the third hierarchy K3, the signals tracked and held in eight different phases carrying information of eight different analog values are outputted from the output terminals Sout11, Sout12, Sout13, Sout14, Sout15, Sout16, Sout17, and Sout18.

While the exemplary embodiment is described by referring to the case where the hierarchical tree structure is formed with three layers (three stages), the tree structure does not necessarily have to be in three layers. It is possible to increase the number of layers (the number of stages) according to the required resolution and to change the number of outputs by increasing the branching number in each layer (each stage).

As described above, with the third exemplary embodiment, it is possible to suppress the power consumption further while achieving the same working effects as the case of the first exemplary embodiment, since there is no track hold circuit operating with the full rate clock.

Other structures and other steps as well as the functions and working effects thereof are the same as the case of the exemplary embodiments described above. Further, the operation contents of each step and structural elements of each section as well as each function thereof in the explanations above may be put into a program (software program) to be executed by a computer.

Fourth Exemplary Embodiment

Next, a fourth exemplary embodiment of the invention will be described. Hereinafter, explanations regarding substantially the same structure as that of the first exemplary embodiment are omitted, and only the different points are to be described.

In the third exemplary embodiment, the frequencies (periods) of the second clock signal (the clock signal inputted to CLK2, CLK3), the third clock signal (the clock signal inputted to CLK4, CLK5, CLK6, CLK7), and the fourth clock signal (the clock signal inputted to CLK8, CLK9, CLK10, CLK11, CLK12, CLK13, CLK14, CLK15) are different from each other.

In the meantime, in the fourth exemplary embodiment, the second frequency of the second clock signal can be set to be a frequency lower (longer period) than the first frequency of the full rate clock.

Further, the third frequency of the third clock signal can be set to be lower (longer period) than the second frequency of the second clock signal.

Furthermore, the fourth frequency of the fourth clock signal can be set to be lower (longer period) than the third frequency of the third clock signal.

Specifically, referring to FIG. 4 that is also used for describing the third exemplary embodiment, the track hold circuits 12 and 13 perform track and hold actions based on a signal longer than a period of full rate clock inputted from the clock signal input terminals CLK2, CLK3 via the clock buffers 37, 38.

The track hold circuits 14, 15, 16, and 17 perform track and hold actions based on a signal longer than a period of the clock inputted to the track hold circuits 12 and 13, which is the signal inputted from the clock signal input terminals CLK4, CLK5, CLK6, CLK7 via the clock buffers 39, 40, 41, 42.

The track hold circuits 18, 19, 20, 21, 22, 23, 24, and 25 perform track and hold actions based on a signal longer than a period of the clock inputted to the track hold circuits 14, 15, 16, and 17, which is the signal inputted from the clock signal input terminals CLK8, CLK9, CLK10, CLK11, CLK12, CLK13, CLK14, CLK15 via the clock buffers 43, 44, 45, 46, 47, 48, 49, 50.

As described above, it is possible with the fourth exemplary embodiment to lower the power consumption further while keeping the same operation effects as the case of the third exemplary embodiment.

Other structures and other steps as well as the functions and working effects thereof are the same as the case of the exemplary embodiments described above. Further, the operation contents of each step and structural elements of each section as well as each function thereof in the explanations above may be put into a program (software program) to be executed by a computer.

Other Various Modification Examples

Further, while the device and the method according to the present invention have been described by referring to some specific embodiments thereof, various modifications of the embodiments depicted in the context of the present invention are possible without departing from the spirit of the present invention.

For example, the number, position, shape, and the like of the above-described structural members are not limited only to those described in the exemplary embodiments. Preferable number, position, shape, and the like thereof for embodying the present invention can be employed.

That is, while the exemplary embodiments have been described by referring to the case where there are fifteen track hold circuits in four hierarchies, the case where there are fourteen track hold circuits in three hierarchies, the case where the branching number of the hierarchical tree structure is two, etc., the present invention is not limited to such numbers.

For example, any branching form (any number) can be employed, as longs as it is the number less than a half of the number of the circuits in the final output layer.

Specifically, in a case where there are sixteen final outputs (there are sixteen circuits in the final output layer), it is possible to employ a hierarchical tree structure constituted with one circuit in the first hierarchy, four circuits in the second hierarchy by branching into four, and sixteen circuits in the third hierarchy by branching each into four.

Furthermore, in a case where there are sixteen final outputs (there are sixteen circuits in the final output layer), it is possible to employ a hierarchical tree structure constituted with one circuit in the first hierarchy, two circuits in the second hierarchy by branching into two, four circuits in the third hierarchy by branching each into two, eight in the fourth hierarchy by branching each into two, and sixteen circuits in the fifth hierarchy by branching each into two.

Note however that it is not desirable to branch a single circuit into nine or more circuits (more than the value that is a half of sixteen) between each of the hierarchies.

Further, the method described above can be achieved by causing a computer to load and execute a program from a recording medium. That is, the above-described program may be recorded on an information recording medium.

Further, according to one exemplary embodiment of the invention, it is possible to form an electronic circuit operation control program capable of achieving various functions by a computer provided to a control signal generation module with an electronic circuit system which includes: a track hold circuit module having a hierarchical tree structure constituted with track hold circuits capable of tracking and holding an analog value of an analog signal; and the control signal generation module which supplies respective operation control signals to each of the track hold circuits.

In this case, the electronic circuit operation control program can cause the computer to achieve: a first control function which controls to set each frequency of the operation control signals supplied to each of the track hold circuits in order to operate each of the track hold circuits, the number of which changes or increases gradually as the hierarchy increases from a first hierarchy on an input side of the hierarchical tree structure towards a final hierarchy on a final output side, at different frequencies in each of the hierarchies; and a second control function which controls to generate each of the operation control signals according to the number for operating each of the track hold circuits also in the hierarchy in a time interleave manner.

In a case where the hierarchical tree structure is in a structure with at least two branched track hold circuits in the first hierarchy and the number of the track hold circuits gradually increase in each of the hierarchies thereafter, the functional contents of the first control function of the electronic circuit operation control program are to control setting according to the hierarchical tree structure and to control setting to change the frequency from the full rate also in the first hierarchy, which can be achieved by a computer. Further, the functional contents of the second control function are to control generation according to the hierarchical tree structure and to control generation of each of the operation control signals for operating each of the track hold circuits also in the first hierarchy in a time interleave manner, which can be achieved by the computer.

Hereinafter, other details of the present invention will be described.

The track hold circuit module according to one exemplary embodiment of the invention is so characterized that: a signal inputted from an input terminal is branched into an arbitrary number to be inputted to the track hold circuits; the outputs thereof are branched into an arbitrary number; there are an arbitrary number of stages; the track hold circuits in each of the hierarchies operate in a time interleave manner; outputs thereof in an arbitrary number are made to a next stage; and the frequencies of the clock signals supplied to each of the hierarchies decrease in order.

The track hold circuit module according to one exemplary embodiment of the invention is so characterized that: a signal inputted from an input terminal is branched into an arbitrary number to be inputted to the track hold circuits; the outputs thereof are branched into an arbitrary number; there are an arbitrary number of stages; the track hold circuits in each of the hierarchies operate in a time interleave manner; outputs thereof in an arbitrary number are made to a next stage; and the clock signals supplied to each of the hierarchies are of different frequencies.

The track hold circuit module according to one exemplary embodiment of the invention is so characterized that: a signal inputted from an input terminal is branched into an arbitrary number to be inputted to the track hold circuits; the outputs thereof are branched into an arbitrary number; there are an arbitrary number of stages; the track hold circuits in each of the hierarchies operate in a time interleave manner; outputs thereof in an arbitrary number are made to a next stage; and the frequencies of the clock signals supplied to each of the hierarchies decrease in order.

The track hold circuit module according to one exemplary embodiment of the invention is characterized to be formed by a tree structure of two stages or more and to have an arbitrary number of stages and branching number.

The track hold circuit module according to one exemplary embodiment of the invention can be executed in a plurality of track and hold operation phases each having a track period for performing a track action and a hold period for performing a hold action. In a step where the track hold circuit module executes a track action in the plurality of track and hold operation phases, it is possible to execute the action with the frequency according to the hierarchy. Further, in a step where the track hold circuit module executes a hold action in the plurality of track and hold operation phases, it is possible to execute the action with the frequency according to the hierarchy.

Furthermore, such device may exist by the device itself and also may be utilized while being mounted into given equipment (e.g., electronic equipment), for example. As the spirit of the present invention, the present invention is not limited only to such cases. It is to be understood that the present invention includes various kinds of forms.

Furthermore, the present invention include a case where a part thereof is achieved by software and a part thereof achieved by hardware. Also, the present invention includes a form where a part thereof is recorded on a storage medium so as to be loaded as necessary.

Further, the scope of the present invention is not limited to those illustrated in the drawings. Furthermore, each of the embodiments includes various steps, and various inventions can be developed therefrom by properly combining a plurality of disclosed structural elements. That is, the present invention includes combinations of each of the above-described embodiments or combinations of any of the embodiments and modifications thereof.

Industrial Applicability

The present invention can be utilized generally to electronic circuits that include track hold circuits.

Reference Numerals

1 Electronic circuit system
10 Track hold circuit module
11-25 Track hold circuit (THA)
36-50 Clock buffer
60 Timing controller (control signal generation module)
CLK1-CLK15 Clock signal input terminal
Sin Analog signal input terminal
Sout11-Sout18 Output terminal

The invention claimed is:

1. An electronic circuit system, comprising:
a track hold circuit module structured by forming track hold circuits capable of tracking and holding an analog value of an analog signal into a hierarchical tree structure; and
a control signal generation module which supplies respective operation control signals to each of the track hold circuits in the hierarchical tree structure, wherein
the hierarchical tree structure is a structure in which the number of the track hold circuits in each of the hierarchies gradually increases as the hierarchy increases from a first hierarchy on an input side to which the analog signal is inputted towards a final hierarchy on a final output side.

2. The electronic circuit system as claimed in claim 1, wherein
the control signal generation module includes:
a first control function which controls the operation control signals in such a manner that each of the track hold circuits in each of the hierarchies operate at different frequencies; and
a second control function which controls the operation control signals in such a manner that each of the track hold circuits within the hierarchy operate in a time interleave manner.

3. The electronic circuit system as claimed in claim 2, wherein
the first control function has a functional content of controlling the operation control signals to decrease the frequencies in order as the hierarchy increases from the first hierarchy towards the final hierarchy.

4. The electronic circuit system as claimed in claim 3, wherein
the hierarchical tree structure is a structure in which there are at least two branched track hold circuits in the first hierarchy, and the number of the track hold circuits gradually increases in each of the hierarchies thereafter.

5. A track hold circuit module having a hierarchical tree structure formed by using track hold circuits capable of tracking and holding an analog value of an analog signal, wherein
the hierarchical tree structure is a structure in which the number of the track hold circuits in each of the hierarchies gradually increases as the hierarchy increases from a first hierarchy on an input side to which the analog signal is inputted towards a final hierarchy on a final output side.

6. The electronic circuit module as claimed in claim 5, wherein
the hierarchical tree structure is a structure in which there are at least two branched track hold circuits in the first hierarchy, and the number of the track hold circuits gradually increases in each of the hierarchies thereafter.

7. An electronic circuit operation control method for controlling an operation of each track hold circuit employed in an electronic circuit system which comprises a track hold circuit module structure by forming the track hold circuits capable of tracking and holding an analog value of an analog signal into a hierarchical tree structure, and a control signal generation module which supplies respective operation control signals to each of the track hold circuits in the hierarchical tree structure, the method comprising:
inputting the analog signal from a first hierarchy on an input side in the hierarchical tree structure;
controlling to set each frequency of respective operation control signals supplied to each of the track hold circuits for respectively operating each of the track hold circuits, the number of which changes gradually as the hierarchy increases towards a final hierarchy on a final output side of the hierarchical tree structure, at different frequencies in each of the hierarchies;
controlling to generate each of the operation control signals according to the number for operating each of the track hold circuits within the hierarchy in a time interleave manner; and outputting each analog value from each output terminal of each of the track hold circuits of the final hierarchy of the hierarchical tree structure.

8. The electronic circuit operation control method as claimed in claim 7, wherein
when controlling to set each of the frequencies, the frequencies are set to be decreased in order as the hierarchy increases from the first hierarchy towards the final hierarchy.

9. The electronic circuit operation control method as claimed in claim 8, wherein:
the hierarchical tree structure is a structure in which there are at least two branched track hold circuits in the first hierarchy, and the number of the track hold circuits gradually increases in each of the hierarchies thereafter;
when controlling to set each of the frequencies, the frequencies are set according to the hierarchical tree structure, and the frequency is changed from a full rate also in the first hierarchy; and
when controlling to generate each of the operation control signals, the operation control signals are generated according to the hierarchical tree structure, and each of the operation control signals are generated for operating each of the track hold circuits in a time interleave manner also in the first hierarchy.

10. A non-transitory computer readable recording medium storing an electronic circuit operation control program for causing a computer, which constitutes a control signal generation module of an electronic circuit system which comprises a track hold circuit module structured by forming track hold circuits capable of tracking and holding an analog value of an analog signal into a hierarchical tree structure and the control signal generation module which supplies respective operation control signals to each of the track hold circuits in the hierarchical tree structure, to execute:
a first control function which controls to set each frequency of operation control signals supplied to each of the track hold circuits for respectively operating each of the track hold circuits, the number of which changes gradually as the hierarchy increases towards a final hierarchy on a final output side of the hierarchical tree structure, at different frequencies in each of the hierarchies; and
a second control function which controls to generate each of the operation control signals according to the number for operating each of the track hold circuits within the hierarchy in a time interleave manner.

11. The non-transitory computer readable recording medium storing the electronic circuit operation control program as claimed in claim 10, which causes the computer to execute a function which controls to set the frequencies to be decreased in order as the hierarchy increases from the first hierarchy towards the final hierarchy.

12. The non-transitory computer readable recording medium storing the electronic circuit operation control program as claimed in claim 11, wherein
the hierarchical tree structure is a structure in which there are at least two branched track hold circuits in the first hierarchy, and the number of the track hold circuits gradually increases in each of the hierarchies thereafter, the program causing the computer to execute:
a function which controls to set the frequencies according to the hierarchical tree structure, and to change the frequency from a full rate also in the first hierarchy; and
a function which controls to generate the operation control signals according to the hierarchical tree structure, and to generate each of the operation control signals for operating each of the track hold circuits in a time interleave manner also in the first hierarchy.

13. An electronic circuit system, comprising:
a track hold circuit module structured by forming track hold circuits capable of tracking and holding an analog value of an analog signal into a hierarchical tree structure; and
control signal generation means for supplying respective operation control signals to each of the track hold circuits in the hierarchical tree structure, wherein
the hierarchical tree structure is a structure in which the number of the track hold circuits in each of the hierarchies gradually increases as the hierarchy increases from a first hierarchy on an input side to which the analog signal is inputted towards a final hierarchy on a final output side.

* * * * *